United States Patent
Okada

(10) Patent No.: US 8,824,581 B2
(45) Date of Patent: Sep. 2, 2014

(54) DATA TRANSMISSION APPARATUS, DATA TRANSMISSION SYSTEM AND DATA TRANSMISSION METHOD

(71) Applicant: Fujitsu Limited, Kawasaki (JP)

(72) Inventor: Seishi Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 13/665,123

(22) Filed: Oct. 31, 2012

(65) Prior Publication Data

US 2013/0223552 A1  Aug. 29, 2013

(30) Foreign Application Priority Data

Feb. 29, 2012  (JP) ................................. 2012-044880

(51) Int. Cl.
*H04K 1/10* (2006.01)

(52) U.S. Cl.
USPC ............ 375/260; 341/180; 370/464; 714/758

(58) Field of Classification Search
CPC .............. H04B 1/00; H04B 3/00; H04B 7/00; H04B 14/00; H04B 17/00; H04B 2001/00; H04B 2201/00; H04J 13/00; H04J 2013/00; H03K 7/00; H03K 9/00; H03L 7/00; H04L 1/00; H04L 5/00; H04L 7/00; H04L 25/00; H04L 27/00; H04L 2001/00; H04L 2007/00; H04L 2025/00; H04L 2027/00; H03M 5/00
See application file for complete search history.

(56) References Cited

U.S. PATENT DOCUMENTS

| | | | |
|---|---|---|---|
| 4,486,739 A | 12/1984 | Franaszek et al. | |
| 2012/0075127 A1 | 3/2012 | Okada | |
| 2012/0290893 A1* | 11/2012 | Hauske et al. | ................ 714/758 |

FOREIGN PATENT DOCUMENTS

| | | | |
|---|---|---|---|
| JP | 09-168000 | * | 6/1997 |
| JP | 2001-014269 | | 1/2001 |
| JP | 2002-271308 | | 9/2002 |
| WO | 2008/059588 | | 5/2008 |
| WO | 2010/146714 | | 12/2010 |
| WO | WO 2010/146715 | | 12/2010 |

OTHER PUBLICATIONS

Japanese Office Action for related Japanese Office Action JP 2012-044880, mailed on May 14, 2013, 7 pages.
PCI Express® Base Specification Revision 3.0, PCI Express, Nov. 10, 2010.

* cited by examiner

*Primary Examiner* — Adolf Dsouza
(74) *Attorney, Agent, or Firm* — Staas & Halsey LLP

(57) ABSTRACT

A data transmission apparatus includes a plurality of transmission data generation units that generate a first symbol by attaching one control bit to data of a predetermined bit length or a second symbol including data of a bit length longer than the predetermined bit length by one bit. The data transmission apparatus includes a transmission unit that transmits the first symbol or the second symbol generated by each of the transmission data generation units. At least one transmission data generation unit, in each timing at which the plurality of transmission data generation units generate the first symbol or the second symbol, generates the first symbol and the other transmission data generation units generate the second symbol.

8 Claims, 34 Drawing Sheets

FIG.4

| BIT POSITION | BIT #75 TO #74 | BIT #73 TO #10 | BIT #9 TO #0 |
|---|---|---|---|
| FIELD NAME | TAG T1 TO T0 | PAYLOAD D63 TO D00 | CRC C9 TO C0 |
| DATA CONTENT | CONTROL CODE (2 BITS) | 8-BYTE PAYLOAD | 10-BIT CRC |

DATA-LINK-LAYER-TO-PHYSICAL-LAYER INTERFACE BUS

FIG.5

| TAG [1:0] | D63 | D62 | D61 TO D00 | NAME | CONTENT OF PAYLOAD DATA |
|---|---|---|---|---|---|
| 00 | 0 | 0 | INVALID DATA (ALL 0) | PAD | INSTEAD OF K CHARACTER PAD, IT IS USED AT LOGICAL IDLE TIME AND INDICATES THAT THERE IS NO DATA TO BE ISSUED AS DATA LINK LAYER PAYLOAD IS ALL-0 DATA |
| 00 | 0 | 1 | 62-BIT PAYLOAD | DLLP | IT IS USED INSTEAD OF K CHARACTER SDP AND INDICATES ISSUE OF DATA LINK LAYER PACKET (DLLP) PAYLOAD IS DLLP DLLP IS NECESSARILY 62-BIT SIZE |
| 00 | 1 | 0 | 62-BIT PAYLOAD | STP | IT IS USED INSTEAD OF K CHARACTER STP AND INDICATES START OF TRANSACTION LAYER PACKET PAYLOAD NECESSARILY INCLUDES HEAD PART FURTHER IT INDICATES THAT PACKETS ARE CONSECUTIVE |
| 00 | 1 | 1 | INVALID DATA (ALL 0) | - | SPARE |
| 01 | 0 | 0 | 62-BIT PAYLOAD | MKUE | IT INDICATES MARKED-UE DATA UNIT NUMBER TO DETECT UNCORRECTABLE ERROR IS INSERTED IN SPECIFIC POSITION OF PAYLOAD FURTHER IT INDICATES THAT PACKETS ARE CONSECUTIVE |
| 01 | 0 | 1 | 62-BIT PAYLOAD | MKUEE | IT INDICATES MARKED-UE DATA UNIT NUMBER TO DETECT UNCORRECTABLE Error IS INSERTED IN SPECIFIC POSITION OF PAYLOAD FURTHER, IT INDICATES THAT PACKET OF PRESENT WORD IS NORMALLY ENDED |
| 01 | 1 | 0 | 62-BIT PAYLOAD | - | SPARE |
| 01 | 1 | 1 | INVALID DATA (ALL 0) | EDB | IT IS USED INSTEAD OF K CHARACTER EDB AND INDICATES ABNORMAL END OF TRANSACTION LAYER PACKET (TLP) PAYLOAD IS INVALID DATA (All0) |
| 10 | | | 64-BIT PAYLOAD | DATA | IT IS 8-BYTE DATA TRANSMITTED SECONDARILY OR SUBSEQUENTLY IN PROTOCOL LAYER PACKET (PLP) OR CMD, AND INDICATES THAT PACKETS ARE CONSECUTIVE INFORMATION INDICATING WHAT BYTE OF DATA IS INCLUDED IN PACKET, IS INDICATED BY PACKET HEADER |
| 11 | | | 64-BIT PAYLOAD | END | IT IS 8-BYTE DATA FINALLY TRANSMITTED IN A PROTOCOL LAYER PACKET (PLP) OR CMD, AND INDICATES THAT PACKET IS NORMALLY ENDED |

FIG.8

| CONTROL BIT | BIT 0 | MEANING |
|---|---|---|
| 1 | 0 | SYMBOL IS D CHARACTER<br>VALUE OF Bit0 IS "0"<br>9 BITS OF Bit0 TO Bit8 AND D SYMBOL VALUE |
| 0 | 1 | SYMBOL IS D CHARACTER<br>VALUE OF Bit0 IS "0"<br>9 BITS OF Bit0 TO Bit8 AND D SYMBOL VALUE |
| 1 | 1 | SYMBOL IS K CHARACTER<br>IT EXPRESSES 8-BIT K CHARACTER OF Bit1 TO Bit8 TAKING INTO ACCOUNT DC BALANCE, AS K CHARACTER VALUES, VALUE FORMED WITH FIVE "0,"S AND "1"S IS SELECTED, EXCEPT FOR ONE KIND MAXIMUM 56 KINDS ($_8C_3$) OF K CHARACTERS CAN BE EXPRESSED |
| 0 | 0 | INVALID SYMBOL EXCEPT FOR SOME EXCEPTIONS |

FIG.9

| BIT CODE | K CHARACTER NAME | MEANING |
|---|---|---|
| 11_0011_0010 | COM | IT INDICATES START OF SKP OS OR EI OS |
| 11_1111_1111 | LONG1 | IT INDICATES START OF TS OS OR EIE OS |
| 00_0000_0000 | LONG0 | IT IS USED TO GENERATE LOW FREQUENCY SIGNAL IN COMBINATION WITH LONG1 USED IN TRAINING SEQUENCE |
| 11_0101_0100 | SKP | IT IS SYMBOL INCREASED OR DECREASED IN SKEW ADJUSTMENT, WHICH INDICATES SKP OS BY FOLLOWING COM |
| 11_1100_1000 | IDL | IT INDICATES EI OS BY FOLLOWING COM |
| OTHER CODES THAN ABOVE | - | INVALID CODE |

| TRANSMISSION SYMBOL CYCLE IDENTIFICATION SIGNAL | K/D IDENTIFICATION SIGNAL | DATA IN SYMBOL | | | | | | | | | |
|---|---|---|---|---|---|---|---|---|---|---|---|
| | | 0 | 1 | 2 | 3 | 4 | 5 | 6 | 7 | 8 | 9 |
| 1 | - | a | b | c | d | e | f | g | h | i | j |
| 0 | 0 | ^b | b | c | d | e | f | g | h | i | j |
| 0 | 1 | 00/11 | K CHARACTER CODE VALUE | | | | | | | | |

FIG.12

| LANE NUMBER | DATA OUTPUT TO EACH LANE | | | | | | | | | |
|---|---|---|---|---|---|---|---|---|---|---|
| | BIT 0 | BIT 1 | BIT 2 | BIT 3 | BIT 4 | BIT 5 | BIT 6 | BIT 7 | BIT 8 | BIT 9 |
| LANE #0 | Ctrl | D57 | D58 | D59 | D60 | D61 | D62 | D63 | T0 | T1 |
| LANE #1 | Ctrl | D48 | D49 | D50 | D51 | D52 | D53 | D54 | D55 | D56 |
| LANE #2 | Ctrl | D39 | D40 | D41 | D42 | D43 | D44 | D45 | D46 | D47 |
| LANE #3 | Ctrl | D30 | D31 | D32 | D33 | D34 | D35 | D36 | D37 | D38 |
| LANE #4 | D20 | D21 | D22 | D23 | D24 | D25 | D26 | D27 | D28 | D29 |
| LANE #5 | D10 | D11 | D12 | D13 | D14 | D15 | D16 | D17 | D18 | D19 |
| LANE #6 | D00 | D01 | D02 | D03 | D04 | D05 | D06 | D07 | D08 | D09 |
| LANE #7 | C0 | C1 | C2 | C3 | C4 | C5 | C6 | C7 | C8 | C9 |

FIG.13

| LANE NUMBER | DATA OUTPUT TO EACH LANE | | | | | | | | | |
|---|---|---|---|---|---|---|---|---|---|---|
| | BIT 0 | BIT 1 | BIT 2 | BIT 3 | BIT 4 | BIT 5 | BIT 6 | BIT 7 | BIT 8 | BIT 9 |
| LANE #0 | C0 | C1 | C2 | C3 | C4 | C5 | C6 | C7 | C8 | C9 |
| LANE #1 | D00 | D01 | D02 | D03 | D04 | D05 | D06 | D07 | D08 | D09 |
| LANE #2 | D10 | D11 | D12 | D13 | D14 | D15 | D16 | D17 | D18 | D19 |
| LANE #3 | D20 | D21 | D22 | D23 | D24 | D25 | D26 | D27 | D28 | D29 |
| LANE #4 | Ctrl | D30 | D31 | D32 | D33 | D34 | D35 | D36 | D37 | D38 |
| LANE #5 | Ctrl | D39 | D40 | D41 | D42 | D43 | D44 | D45 | D46 | D47 |
| LANE #6 | Ctrl | D48 | D49 | D50 | D51 | D52 | D53 | D54 | D55 | D56 |
| LANE #7 | Ctrl | D57 | D58 | D59 | D60 | D61 | D62 | D63 | T0 | T1 |

FIG.14

| | | EVEN-NUMBER CYCLE | ODD-NUMBER CYCLE | EVEN-NUMBER CYCLE | ODD-NUMBER CYCLE |
|---|---|---|---|---|---|
| FIRST GROUP | LANE #0 | 9-BIT PAYLOAD C | 10-BIT PAYLOAD (CRC) | 9-BIT PAYLOAD C | 10-BIT PAYLOAD (CRC) |
| | LANE #1 | 9-BIT PAYLOAD C | 10-BIT PAYLOAD | 9-BIT PAYLOAD C | 10-BIT PAYLOAD |
| | LANE #2 | 9-BIT PAYLOAD C | 10-BIT PAYLOAD | 9-BIT PAYLOAD C | 10-BIT PAYLOAD |
| | LANE #3 | 9-BIT PAYLOAD C | 10-BIT PAYLOAD | 9-BIT PAYLOAD C | 10-BIT PAYLOAD |
| SECOND GROUP | LANE #4 | 10-BIT PAYLOAD | 9-BIT PAYLOAD C | 10-BIT PAYLOAD | 9-BIT PAYLOAD C |
| | LANE #5 | 10-BIT PAYLOAD | 9-BIT PAYLOAD C | 10-BIT PAYLOAD | 9-BIT PAYLOAD C |
| | LANE #6 | 10-BIT PAYLOAD | 9-BIT PAYLOAD C | 10-BIT PAYLOAD | 9-BIT PAYLOAD C |
| | LANE #7 | 10-BIT PAYLOAD (CRC) | 9-BIT PAYLOAD C | 10-BIT PAYLOAD (CRC) | 9-BIT PAYLOAD C |

FIG.16

| RECEPTION SYMBOL CYCLE IDENTIFICATION SIGNAL | 10-BIT PARALLEL INPUT | | K/D IDENTIFICATION SIGNAL | ERROR SIGNAL | OUTPUT DATA | | | | | | | | | |
|---|---|---|---|---|---|---|---|---|---|---|---|---|---|---|
| | a, b | c TO j | | | 0 | 1 | 2 | 3 | 4 | 5 | 6 | 7 | 8 | 9 |
| 1 | - | - | 0 | 0 | a | b | c | d | e | f | g | h | i | j |
| 0 | 01 OR 10 | D CHARACTER | 0 | 0 | "0" | b | c | d | e | f | g | h | i | j |
| 0 | 00 OR 11 | K CHARACTER | 1 | 0 | a | b | c | d | e | f | g | h | i | j |
| | | OTHERS | 0 | 1 | (K CHARACTER VALUE) | | | | | | | | | |
| | | | | | UNDEFINED | | | | | | | | | |

FIG.18

| STATE NAME | MEANING OF STATE |
|---|---|
| PORTDIS | IT IS STATE FOR WAITING FOR LINK INITIALIZATION INSTRUCTION AND TRANSITS BY INSTRUCTION FROM OUTSIDE |
| POLL | IT IS STATE TO TRANSMIT/RECEIVE TS OS TO/FROM CONNECTION DESTINATION PORT AND CHECK WHETHER COMMUNICATION IS POSSIBLE |
| CONFIG | IT IS STATE TO TRANSMIT/RECEIVE TS OS TO/FROM CONNECTION DESTINATION PORT AT TIME OF LINK INITIALIZATION OR RETRAINING EXECUTION AND PERFORM LINK FORMATION |
| LZ (L0, L0s) | IT IS CONDITION STATE IN WHICH IT IS POSSIBLE TO TRANSMIT OR RECEIVE HIGHER LAYER PACKET |
| RECOVERY | IT IS STATE TO PERFORM RETRAINING |
| L1 | IT IS STATE OF LOW POWER-SAVING CONDITION AND TRANSITS TO L0 STATE BY PERFORMING RETRAINING |
| LOOPBACK | IT IS STATE TO TEST LOOP BACK |
| PreConfigre | IT STARTS RETRAINING AGAIN WHEN MULTI-BIT LINK ERROR OCCURS DURING RETRAINING |

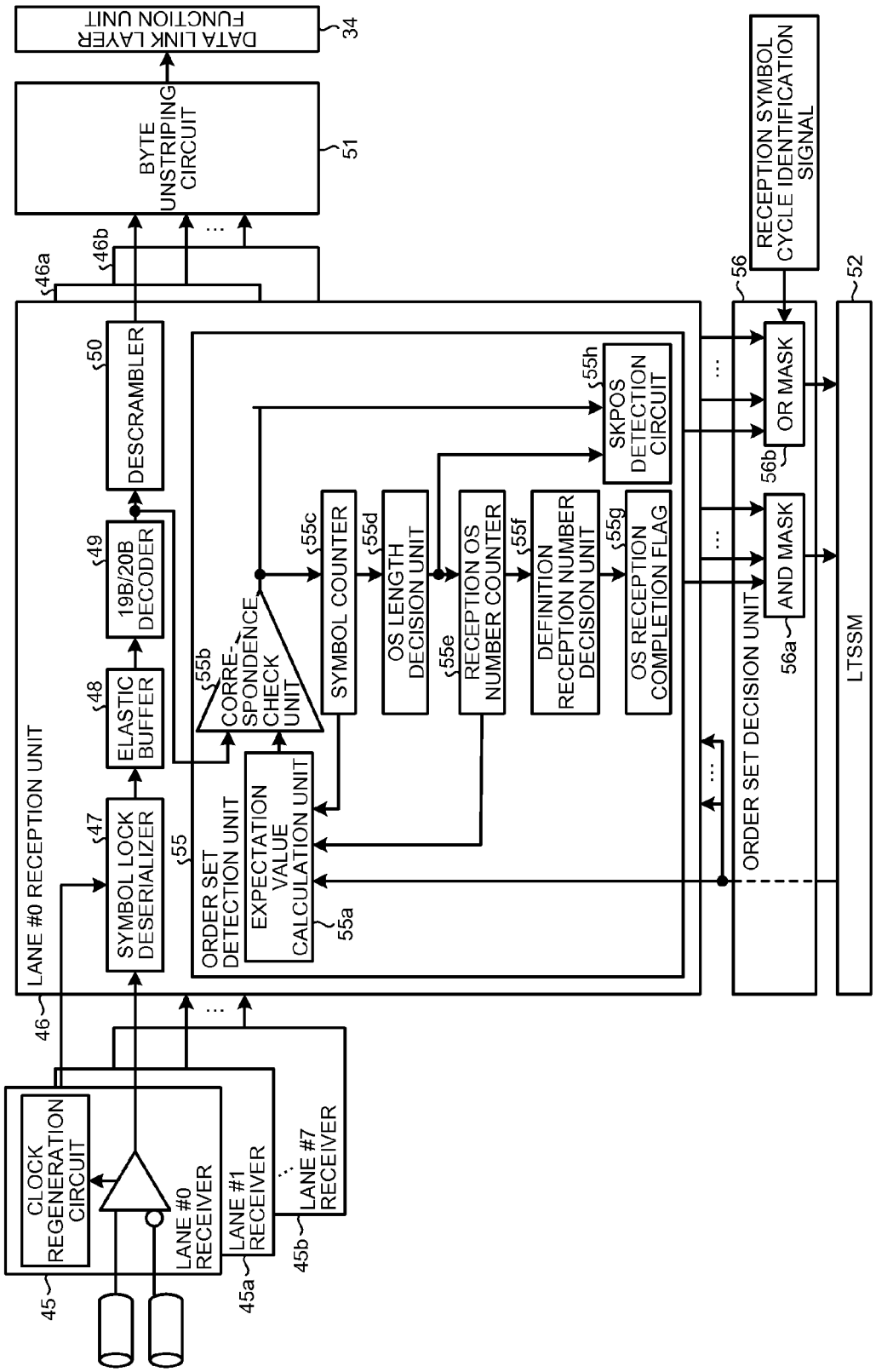

FIG.21

| | | EVEN-NUMBER CYCLE | ODD-NUMBER CYCLE | EVEN-NUMBER CYCLE | ODD-NUMBER CYCLE |
|---|---|---|---|---|---|
| LANE #0 | C 9-BIT PAYLOAD ... C 9-BIT PAYLOAD | C 9-BIT PAYLOAD | 10-BIT CRC | C 9-BIT PAYLOAD | 10-BIT CRC |
| LANE #1 | C 9-BIT PAYLOAD ... C 9-BIT PAYLOAD | C 9-BIT PAYLOAD | 10-BIT PAYLOAD | C 9-BIT PAYLOAD | 10-BIT PAYLOAD |
| LANE #2 | C 9-BIT PAYLOAD ... C 9-BIT PAYLOAD | C 9-BIT PAYLOAD | 10-BIT PAYLOAD | C 9-BIT PAYLOAD | 10-BIT PAYLOAD |
| LANE #3 | C 9-BIT PAYLOAD ... C 9-BIT PAYLOAD | C 9-BIT PAYLOAD | 10-BIT PAYLOAD | C 9-BIT PAYLOAD | 10-BIT PAYLOAD |
| LANE #4 | C 9-BIT PAYLOAD ... C 9-BIT PAYLOAD | 10-BIT PAYLOAD | C 9-BIT PAYLOAD | 10-BIT PAYLOAD | C 9-BIT PAYLOAD |
| LANE #5 | C 9-BIT PAYLOAD ... C 9-BIT PAYLOAD | 10-BIT PAYLOAD | C 9-BIT PAYLOAD | 10-BIT PAYLOAD | C 9-BIT PAYLOAD |
| LANE #6 | C 9-BIT PAYLOAD ... C 9-BIT PAYLOAD | 10-BIT PAYLOAD | C 9-BIT PAYLOAD | 10-BIT PAYLOAD | C 9-BIT PAYLOAD |
| LANE #7 | C 9-BIT PAYLOAD ... C 9-BIT PAYLOAD | 10-BIT CRC | C 9-BIT PAYLOAD | 10-BIT CRC | C 9-BIT PAYLOAD |
| | (G) | (H) | | | |

FIG.22

| | EVEN-NUMBER CYCLE | COM SYMBOL | SKP SYMBOL | SKP SYMBOL | EVEN-NUMBER CYCLE | ODD-NUMBER CYCLE |
|---|---|---|---|---|---|---|
| LANE #0 | C 9-BIT PAYLOAD | C K CHARACTER | C K CHARACTER | C K CHARACTER | C 9-BIT PAYLOAD | 10-BIT CRC |
| LANE #1 | C 9-BIT PAYLOAD | C K CHARACTER | C K CHARACTER | C K CHARACTER | C 9-BIT PAYLOAD | 10-BIT PAYLOAD |
| LANE #2 | C 9-BIT PAYLOAD | C K CHARACTER | C K CHARACTER | C K CHARACTER | C 9-BIT PAYLOAD | 10-BIT PAYLOAD |
| LANE #3 | C 9-BIT PAYLOAD | C K CHARACTER | C K CHARACTER | C K CHARACTER | C 9-BIT PAYLOAD | 10-BIT PAYLOAD |
| LANE #4 | 10-BIT PAYLOAD | C K CHARACTER | C K CHARACTER | C K CHARACTER | 10-BIT PAYLOAD | C 9-BIT PAYLOAD |
| LANE #5 | 10-BIT PAYLOAD | C K CHARACTER | C K CHARACTER | C K CHARACTER | 10-BIT PAYLOAD | C 9-BIT PAYLOAD |
| LANE #6 | 10-BIT PAYLOAD | C K CHARACTER | C K CHARACTER | C K CHARACTER | 10-BIT PAYLOAD | C 9-BIT PAYLOAD |
| LANE #7 | 10-BIT CRC | C K CHARACTER | C K CHARACTER | C K CHARACTER | 10-BIT CRC | C 9-BIT PAYLOAD |

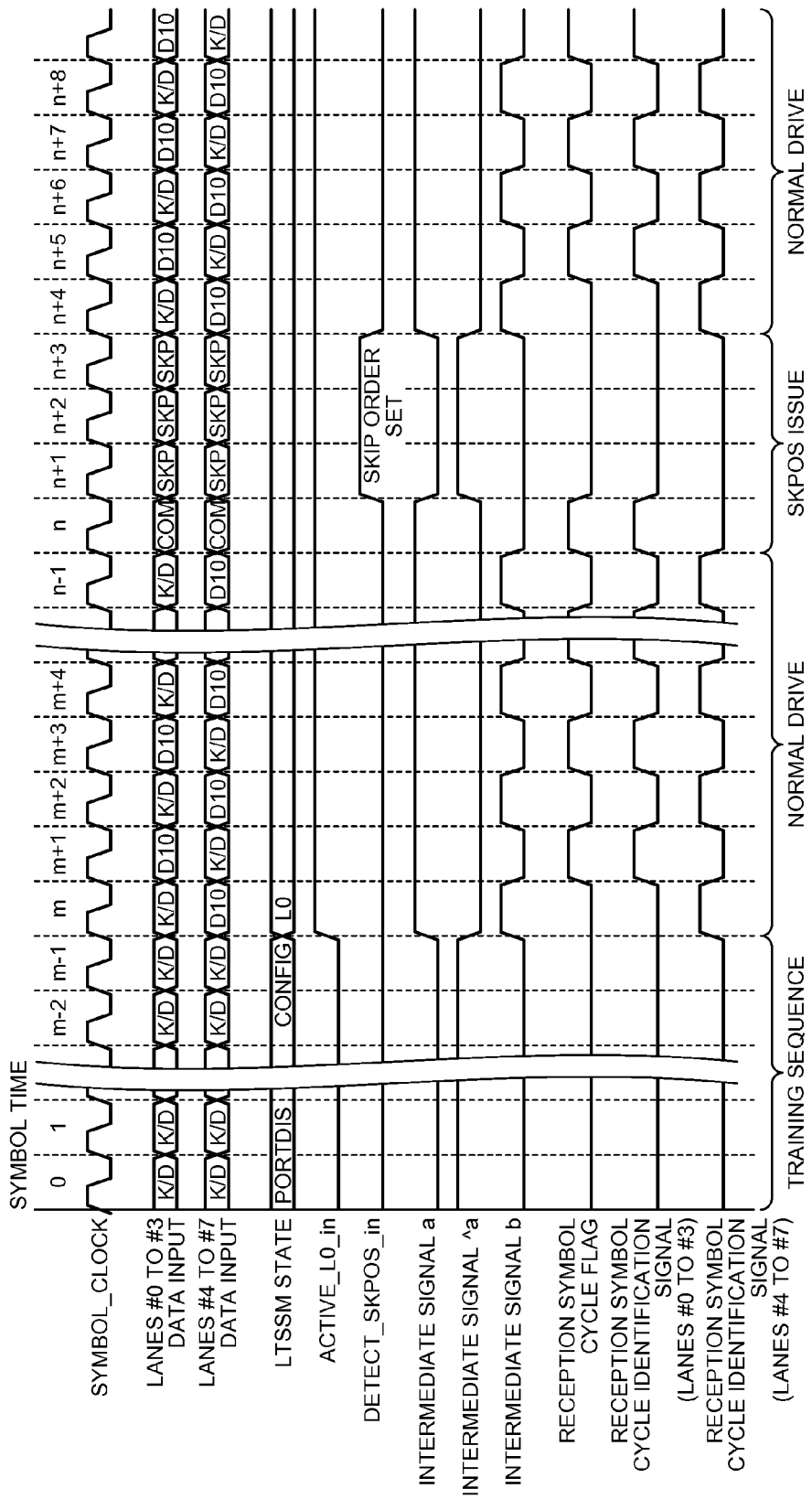

FIG.27

| LANE NUMBER | AT TIME OF EVEN-NUMBER CYCLE | | | | | | | | | | AT TIME OF ODD-NUMBER CYCLE | | | | | | | | | |
|---|---|---|---|---|---|---|---|---|---|---|---|---|---|---|---|---|---|---|---|---|
| | 1st | 2nd | 3rd | 4th | 5th | 6th | 7th | 8th | 9th | 10th | 1st | 2nd | 3rd | 4th | 5th | 6th | 7th | 8th | 9th | 10th |
| LANE #0 | Ctrl | D57 | D58 | D59 | D60 | D61 | D62 | D63 | T0 | T1 | C0 | C1 | C2 | C3 | C4 | C5 | C6 | C7 | C8 | C9 |
| LANE #1 | Ctrl | D48 | D49 | D50 | D51 | D52 | D53 | D54 | D55 | D56 | D00 | D01 | D02 | D03 | D04 | D05 | D06 | D07 | D08 | D09 |
| LANE #2 | Ctrl | D39 | D40 | D41 | D42 | D43 | D44 | D45 | D46 | D47 | D10 | D11 | D12 | D13 | D14 | D15 | D16 | D17 | D18 | D19 |
| LANE #3 | Ctrl | D30 | D31 | D32 | D33 | D34 | D35 | D36 | D37 | D38 | D20 | D21 | D22 | D23 | D24 | D25 | D26 | D27 | D28 | D29 |
| LANE #4 | D20 | D21 | D22 | D23 | D24 | D25 | D26 | D27 | D28 | D29 | Ctrl | D30 | D31 | D32 | D33 | D34 | D35 | D36 | D37 | D38 |
| LANE #5 | D10 | D11 | D12 | D13 | D14 | D15 | D16 | D17 | D18 | D19 | Ctrl | D39 | D40 | D41 | D42 | D43 | D44 | D45 | D46 | D47 |
| LANE #6 | D00 | D01 | D02 | D03 | D04 | D05 | D06 | D07 | D08 | D09 | Ctrl | D48 | D49 | D50 | D51 | D52 | D53 | D54 | D55 | D56 |
| LANE #7 | C0 | C1 | C2 | C3 | C4 | C5 | C6 | C7 | T0 | T1 | Ctrl | D57 | D58 | D59 | D60 | D61 | D62 | D63 | T0 | T1 |

FIG.28

| SYMBOL CYCLE TIME | BIT 75 TO 74 | BIT 73 TO 67 | BIT 66 TO 58 | BIT 57 TO 49 | BIT 48 TO 40 | BIT 39 TO 30 | BIT 29 TO 20 | BIT 19 TO 10 | BIT 09 TO 00 |
|---|---|---|---|---|---|---|---|---|---|
| AT TIME OF EVEN TO NUMBER CYCLE | TAG T1 TO T0 | PAYLOAD D63 TO D57 | PAYLOAD D56 TO D48 | PAYLOAD D47 TO D39 | PAYLOAD D38 TO D30 | PAYLOAD D29 TO D20 | PAYLOAD D19 TO D10 | PAYLOAD D09 TO D00 | CRC C9 TO C0 |
| AT TIME OF ODD TO NUMBER CYCLE | TAG T1 TO T0 | PAYLOAD D63 TO D57 | PAYLOAD D56 TO D48 | PAYLOAD D47 TO D39 | PAYLOAD D38 TO D30 | PAYLOAD D29 TO D20 | PAYLOAD D19 TO D10 | PAYLOAD D09 TO D00 | CRC C9 TO C0 |

FIG.29

| | | A CYCLE | B CYCLE | C CYCLE | D CYCLE |
|---|---|---|---|---|---|
| FIRST GROUP | LANE #0 | 9-BIT PAYLOAD C | 10-BIT PAYLOAD | 10-BIT PAYLOAD | 10-BIT PAYLOAD |
| | LANE #1 | 9-BIT PAYLOAD C | 10-BIT PAYLOAD | 10-BIT PAYLOAD | 10-BIT PAYLOAD (CRC) |
| SECOND GROUP | LANE #2 | 10-BIT PAYLOAD | 9-BIT PAYLOAD C | 10-BIT PAYLOAD | 10-BIT PAYLOAD |
| | LANE #3 | 10-BIT PAYLOAD | 9-BIT PAYLOAD C | 10-BIT PAYLOAD (CRC) | 10-BIT PAYLOAD |
| THIRD GROUP | LANE #4 | 10-BIT PAYLOAD | 10-BIT PAYLOAD | 9-BIT PAYLOAD C | 10-BIT PAYLOAD |
| | LANE #5 | 10-BIT PAYLOAD | 10-BIT PAYLOAD (CRC) | 9-BIT PAYLOAD C | 10-BIT PAYLOAD |
| FOURTH GROUP | LANE #6 | 10-BIT PAYLOAD | 10-BIT PAYLOAD | 10-BIT PAYLOAD | 9-BIT PAYLOAD C |
| | LANE #7 | 10-BIT PAYLOAD (CRC) | 10-BIT PAYLOAD | 10-BIT PAYLOAD | 9-BIT PAYLOAD C |

FIG.30

AT TIME OF A CYCLE

| LANE NUMBER | ORDER OF BITS OUTPUT TO SERIAL BUS | | | | | | | | | |
|---|---|---|---|---|---|---|---|---|---|---|
| | 1st | 2nd | 3rd | 4th | 5th | 6th | 7th | 8th | 9th | 10th |
| LANE #0 | Ctrl | D59 | D60 | D61 | D62 | D63 | T0 | T1 | T2 | T3 |
| LANE #1 | Ctrl | D50 | D51 | D52 | D53 | D54 | D55 | D56 | D57 | D58 |
| LANE #2 | D40 | D41 | D42 | D43 | D44 | D45 | D46 | D47 | D48 | D49 |
| LANE #3 | D30 | D31 | D32 | D33 | D34 | D35 | D36 | D37 | D38 | D39 |
| LANE #4 | D20 | D21 | D22 | D23 | D24 | D25 | D26 | D27 | D28 | D29 |
| LANE #5 | D10 | D11 | D12 | D13 | D14 | D15 | D16 | D17 | D18 | D19 |
| LANE #6 | D00 | D01 | D02 | D03 | D04 | D05 | D06 | D07 | D08 | D09 |
| LANE #7 | C0 | C1 | C2 | C3 | C4 | C5 | C6 | C7 | C8 | C9 |

AT TIME OF B CYCLE

| LANE NUMBER | ORDER OF BITS OUTPUT TO SERIAL BUS | | | | | | | | | |
|---|---|---|---|---|---|---|---|---|---|---|
| | 1st | 2nd | 3rd | 4th | 5th | 6th | 7th | 8th | 9th | 10th |
| LANE #0 | D40 | D41 | D42 | D43 | D44 | D45 | D46 | D47 | D48 | D49 |
| LANE #1 | D30 | D31 | D32 | D33 | D34 | D35 | D36 | D37 | D38 | D39 |
| LANE #2 | Ctrl | D59 | D60 | D61 | D62 | D63 | T0 | T1 | T2 | T3 |
| LANE #3 | Ctrl | D50 | D51 | D52 | D53 | D54 | D55 | D56 | D57 | D58 |
| LANE #4 | D00 | D01 | D02 | D03 | D04 | D05 | D06 | D07 | D08 | D09 |
| LANE #5 | C0 | C1 | C2 | C3 | C4 | C5 | C6 | C7 | C8 | C9 |
| LANE #6 | D20 | D21 | D22 | D23 | D24 | D25 | D26 | D27 | D28 | D29 |
| LANE #7 | D10 | D11 | D12 | D13 | D14 | D15 | D16 | D17 | D18 | D19 |

AT TIME OF C CYCLE

| LANE NUMBER | ORDER OF BITS OUTPUT TO SERIAL BUS | | | | | | | | | |
|---|---|---|---|---|---|---|---|---|---|---|
| | 1st | 2nd | 3rd | 4th | 5th | 6th | 7th | 8th | 9th | 10th |
| LANE #0 | D20 | D21 | D22 | D23 | D24 | D25 | D26 | D27 | D28 | D29 |
| LANE #1 | D10 | D11 | D12 | D13 | D14 | D15 | D16 | D17 | D18 | D19 |
| LANE #2 | D00 | D01 | D02 | D03 | D04 | D05 | D06 | D07 | D08 | D09 |
| LANE #3 | C0 | C1 | C2 | C3 | C4 | C5 | C6 | C7 | C8 | C9 |
| LANE #4 | Ctrl | D59 | D60 | D61 | D62 | D63 | T0 | T1 | T2 | T3 |
| LANE #5 | Ctrl | D50 | D51 | D52 | D53 | D54 | D55 | D56 | D57 | D58 |
| LANE #6 | D40 | D41 | D42 | D43 | D44 | D45 | D46 | D47 | D48 | D49 |
| LANE #7 | D30 | D31 | D32 | D33 | D34 | D35 | D36 | D37 | D38 | D39 |

AT TIME OF D CYCLE

| LANE NUMBER | ORDER OF BITS OUTPUT TO SERIAL BUS | | | | | | | | | |
|---|---|---|---|---|---|---|---|---|---|---|
| | 1st | 2nd | 3rd | 4th | 5th | 6th | 7th | 8th | 9th | 10th |
| LANE #0 | D00 | D01 | D02 | D03 | D04 | D05 | D06 | D07 | D08 | D09 |
| LANE #1 | C0 | C1 | C2 | C3 | C4 | C5 | C6 | C7 | C8 | C9 |
| LANE #2 | D20 | D21 | D22 | D23 | D24 | D25 | D26 | D27 | D28 | D29 |
| LANE #3 | D10 | D11 | D12 | D13 | D14 | D15 | D16 | D17 | D18 | D19 |
| LANE #4 | D40 | D41 | D42 | D43 | D44 | D45 | D46 | D47 | D48 | D49 |
| LANE #5 | D30 | D31 | D32 | D33 | D34 | D35 | D36 | D37 | D38 | D39 |
| LANE #6 | Ctrl | D59 | D60 | D61 | D62 | D63 | T0 | T1 | T2 | T3 |
| LANE #7 | Ctrl | D50 | D51 | D52 | D53 | D54 | D55 | D56 | D57 | D58 |

FIG.33

| CODE | SYMBOL | NAME | MEANING |
|---|---|---|---|
| K28.5 | COM | COMMA | INITIALIZATION AND MANAGEMENT OF LANE AND LINK |
| K28.7 | STP | START TLP | START OF TRANSACTION, LAYER AND PACKET |
| K28.2 | SDP | START DLLP | START OF DATA, LINK, LAYER AND PACKET |
| K29.7 | END | END | END OF PACKET |
| K30.7 | EDB | END BAD | END OF INVALID PACKET |
| K23.7 | PAD | PAD | FILLING IN CASE WHERE VALID DATA IS DIFFICULT TO BE INSERTED DUE TO LINK RULE |
| K28.0 | SKP | SKIP | ADJUSTMENT OF CLOCK JITTER ON TRANSMISSION SIDE AND RECEPTION SIDE |
| K28.1 | FTS | FAST TRAINING SEQUENCE | FOR USE IN SPECIFIC ORDER SET IN ORDER TO SHIFT TO L0 THROUGH L0s |
| K28.3 | IDL | IDLE | FOR USE IN ELECTRICAL IDLE ORDER SET |
| K28.4 | - | - | SPARE |
| K28.6 | - | - | SPARE |
| K28.7 | - | - | SPARE |

| DATA CHARACTER NAME | DATA CHARACTER VALUE | DATA CHARACTER VALUE HGFE_DCBA | CURRENT RUNNING DISPARITY IS NEGATIVE ab_cdei_fghj | CURRENT RUNNING DISPARITY IS POSITIVE ab_cdei_fghj |
|---|---|---|---|---|
| D00.0 | 00h | 0000_0000 | 10_0111_0100 | 01_1000_1011 |
| D12.3 | 6Ch | 0110_1100 | 00_1101_1100 | 00_1101_0011 |
| D12.4 | 8Ch | 1000_1100 | 00_1101_1101 | 00_1101_0010 |
| D31.2 | 5Fh | 0101_1111 | 10_1011_0101 | 01_0100_0101 |
| D20.2 | 54h | 0101_0100 | 00_1011_0101 | 00_1011_0101 |

FIG.38

| | BYTE #08 | BYTE #07 | BYTE #06 | BYTE #05 | BYTE #04 | BYTE #03 | BYTE #02 | BYTE #01 | BYTE #00 |
|---|---|---|---|---|---|---|---|---|---|
| DATA OF TRANSMISSION BUFFER (NORMAL DATA) | 5Fh<br>0101_1111 | 00h<br>0000_0000 | 00h<br>0000_0000 | 00h<br>0000_0000 | 00h<br>0000_0000 | 00h<br>0000_0000 | 00h<br>0000_0000 | 00h<br>0000_0000 | 6Ch<br>0110_1100 |
| DATA OF RECEPTION BUFFER (ABNORMAL DATA) | 54h<br>0101_0100 | 00h<br>0000_0000 | 00h<br>0000_0000 | 00h<br>0000_0000 | 00h<br>0000_0000 | 00h<br>0000_0000 | 00h<br>0000_0000 | 00h<br>0000_0000 | 8Ch<br>1000_1100 |

(F)

DATA TRANSMISSION APPARATUS, DATA TRANSMISSION SYSTEM AND DATA TRANSMISSION METHOD

CROSS-REFERENCE TO RELATED APPLICATION

This application is based upon and claims the benefit of priority of the prior Japanese Patent Application No. 2012-044880, filed on Feb. 29, 2012, the entire contents of which are incorporated herein by reference.

FIELD

The embodiments discussed herein are directed to a data transmission apparatus, a data transmission system and a data transmission method.

BACKGROUND

In the related art, a serial transmission technique to transmit data of a one-bit width via a transmission path is known. As an example of such a serial transmission technique, a coding scheme called "8B (Bit)/10B scheme" is adopted. To be more specific, in the 8B/10B coding scheme, a look-up table defined in advance is used to perform table conversion of 8-bit data called "D character" or a control character called "K character" into 10-bit data and transmit the 10-bit data.

Here, in the 8B/10B coding scheme, the look-up table is defined such that consecutive bits are equal to or below 5 bits in the transmitted 10-bit data. Therefore, since the 10-bit data converted in the 8B/10B coding scheme includes at least one bit value transition, clock regeneration on the data reception side is facilitated.

Patent Literature 1: U.S. Pat. No. 4,486,739
Patent Literature 2: International Publication Pamphlet No. WO 2010/146715
Non Patent Literature 1: PCI Express Base Specification Revision 3.0., PCI-SIG., Nov. 10, 2010

However, in the above 8B/10B coding scheme, since 8-bit data is converted into 10-bit data and transmitted, the overhead of serial transmission increases, which results in causing a problem that the transmission efficiency degrades. For example, an LSI that transmits data in the 8B/10B coding scheme transmits 10-bit data to transmit 8-bit data, and therefore a bandwidth used for data transmission is increased by 25 percent, for example.

SUMMARY

According to an aspect of an embodiment, a data transmission apparatus includes a plurality of transmission paths that transmit data one bit at a time. The data transmission apparatus includes a plurality of transmission data generation units that generate a first symbol by attaching one control bit to data of a predetermined bit length or a second symbol including data of a bit length longer than the predetermined bit length by one bit, from transmission target data or control data to adjust the transmission paths. The data transmission apparatus includes a transmission unit that transmits the first symbol or the second symbol generated by each of the transmission data generation units, to a facing apparatus via respective transmission paths of the transmission data generation units. The plurality of transmission data generation units switch a symbol to be generated between the first symbol and the second symbol in a predetermined period, and, in each timing at which the plurality of transmission data generation units generate the first symbol or the second symbol, at least one tansmission data generation unit generates the first symbol and the other transmission data generation units generate the second symbol.

According to another aspect of an embodiment, a data transmission apparatus includes a first data generation unit that generates a first data attaching a one bit control bit to data of a first data length included in transmission data, and generates a second data whose data length is longer by one bit than the first data length. The data transmission apparatus includes a first transmission unit that transmits the first data generated by the first data generation unit and the second data generated by the first data generation unit, in a predetermined order. The data transmission apparatus includes a second data generation unit that generates the first data and the second data. The data transmission apparatus includes a second transmission unit that transmits the first data generated by the second data generation unit and the second data generated by the second data generation unit via a different transmission path from the first transmission unit, a transmission period in which the first transmission unit transmits the first data and a transmission period in which the second transmission unit transmits the first data are shifted so as not to temporally overlap.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram for explaining a packet in a data link layer;

FIG. 5 is a diagram for explaining packet formats in a data link layer;

FIG. 8 is a diagram for explaining a 10-bit symbol code according to the first embodiment;

FIG. 9 is a diagram for explaining bit codes of K characters according to the first embodiment;

FIG. 12 is a diagram for explaining data output to lanes #0 to #7 at the time of even-number cycle;

FIG. 13 is a diagram for explaining data output to lanes #0 to #7 at the time of odd-number cycle;

FIG. 14 is a diagram for explaining the order of first symbols output by lanes #0 to #7 according to the first embodiment;

FIG. 16 is a diagram for explaining an operation of a 19B/20B decoder according to the first embodiment;

FIG. 18 is a diagram for explaining each condition of an LTSSM;

FIG. 20 is a diagram for explaining a functional configuration of an order set detection unit according to the first embodiment;

FIG. 21 is a diagram for explaining a sequence of data output by a transmission unit according to the first embodiment;

FIG. 22 is a diagram for explaining a skip order set according to the first embodiment;

FIG. 26 is a timing chart for explaining an operation of a reception timing generation circuit according to the first embodiment;

FIG. 27 is a diagram for explaining a burst error in lane #2;

FIG. 28 is a diagram for explaining data received at the time a burst error occurs;

FIG. 29 is a diagram for explaining variations of data outputs;

FIG. 30 is a diagram for explaining an example of data output at the time of each cycle;

FIG. 33 is a diagram for explaining an example of K characters;

FIG. 38 is a diagram for explaining error data in a case where a burst error occurs.

DESCRIPTION OF EMBODIMENTS

Preferred embodiments of the present invention will be explained with reference to accompanying drawings.

[a] First Embodiment

First, in order to clarify an advantage provided by a data transmission apparatus according to a first embodiment, a problem in an 8B/10B coding scheme in the related art will be explained. First, as an example of a serial transmission technique to transmit data using the 8B/10B coding scheme in the related art, a technique of PCIe (Peripheral Component Interconnect Express) will be explained.

In the following, an LSI (Large Scale Integrated circuit) to transmit data using the PCIe technique will be explained using the drawings. Also, in the following example, an example will be explained where a data transmission side LSI and a data reception side LSI are connected to each other via a plurality of lanes bundling a plurality of serial buses and data is transmitted via the plurality of lanes.

Figure 31:
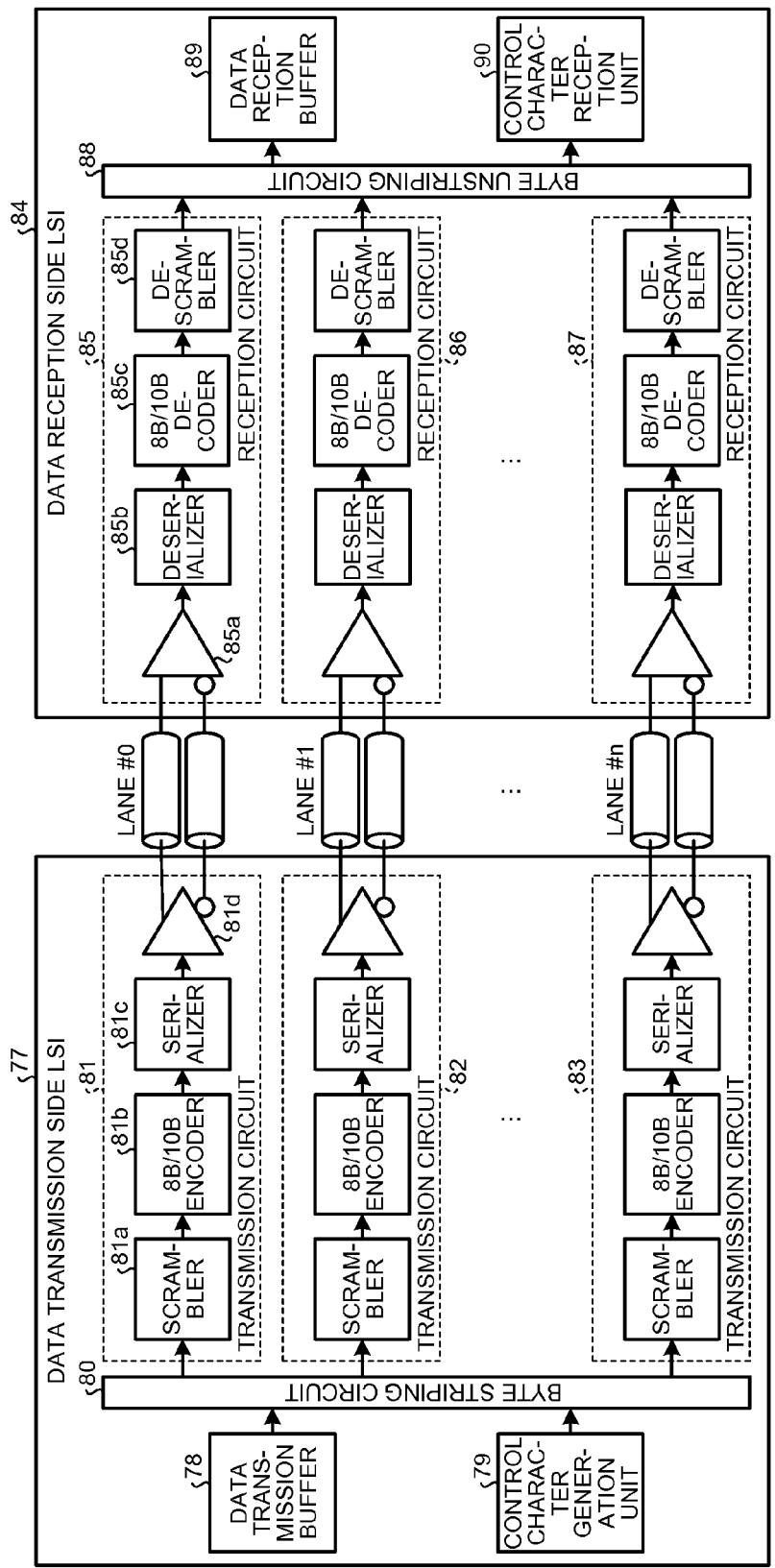
FIG. 31 is a diagram for explaining a high-performance serial bus formed with a plurality of lanes.

FIG. 31 is a diagram for explaining a high-performance serial bus formed with a plurality of lanes. In the example illustrated in FIG. 31, a data transmission side LSI 77 and a data reception side LSI 84 are connected to each other by a plurality of lanes #0 to #n to transmit and receive data by serial transmission.

In the example illustrated in FIG. 31, the data transmission side LSI 77 includes a data transmission buffer 78, a control character generation unit 79, a byte striping circuit 80 and a plurality of transmission circuits 81 to 83. Also, the transmission circuit 81 includes a scrambler 81a, an 8B/10B encoder 81b, a serializer 81c and a driver 81d. Here, the transmission circuit 82 and the transmission circuit 83 fulfill similar functions to those in the transmission circuit 81, and therefore their explanation will be omitted.

Meanwhile, the data reception side LSI 84 includes a plurality of reception circuits 85 to 87, a byte unstriping circuit 88, a data reception buffer 89 and a control character reception unit 90. Also, the reception circuit 85 includes a receiver 85a, a deserializer 85b, an 8B/10B decoder 85c and a descrambler 85d. Here, the reception circuit 86 and the reception circuit 87 fulfill similar functions to those in the reception circuit 85, and therefore their explanation will be omitted.

The data transmission buffer 78 is a buffer to store data transmitted by the data transmission side LSI 77. Also, the control character generation unit 79 generates a K character to perform control such as initialization, error data operation and adjustment of transmission-side-to-reception-side clock jitter. Also, the byte striping circuit 80 performs byte striping processing of sorting the data received from the data transmission buffer 78 and the control character generation unit 79 into each lane #0 to #n by one byte each.

Also, the scrambler 81a performs random number conversion of data which the byte striping circuit 80 assigns to lane #0. The 8B/10B encoder 81b converts the 8-bit data subjected to the random number conversion in the scrambler 81a into 10 bits, according to a look-up table defined in advance. Also, the serializer 81c performs serial conversion of the 10-bit data converted by the 8B/10B encoder 81b. The driver 81d transmits the serially-converted data to the data reception side LSI 84 via lane #0.

Meanwhile, the receiver 85a receives the data transmitted by the driver 81d via lane #0. Also, the deserializer 85b performs parallel conversion of the data received by the receiver 85a into the 10-bit data. Also, the 8B/10B decoder 85c converts the 10-bit data converted by the deserializer 85b into the original 8-bit data using the look-up table similar to that of the 8B/10B encoder 81b. Also, the descrambler 85d performs conversion inverse to the random number conversion by the scrambler 81a.

Also, by performing processing inverse to that in the byte striping circuit 80, the byte unstriping circuit 88 causes the data received by the reception circuits 85 to 87 via lanes #0 to #n to be provided in the original order. Further, the byte unstriping circuit 88 outputs the original-order data to the data reception buffer 89 or the control character reception unit 90.

Figure 32:
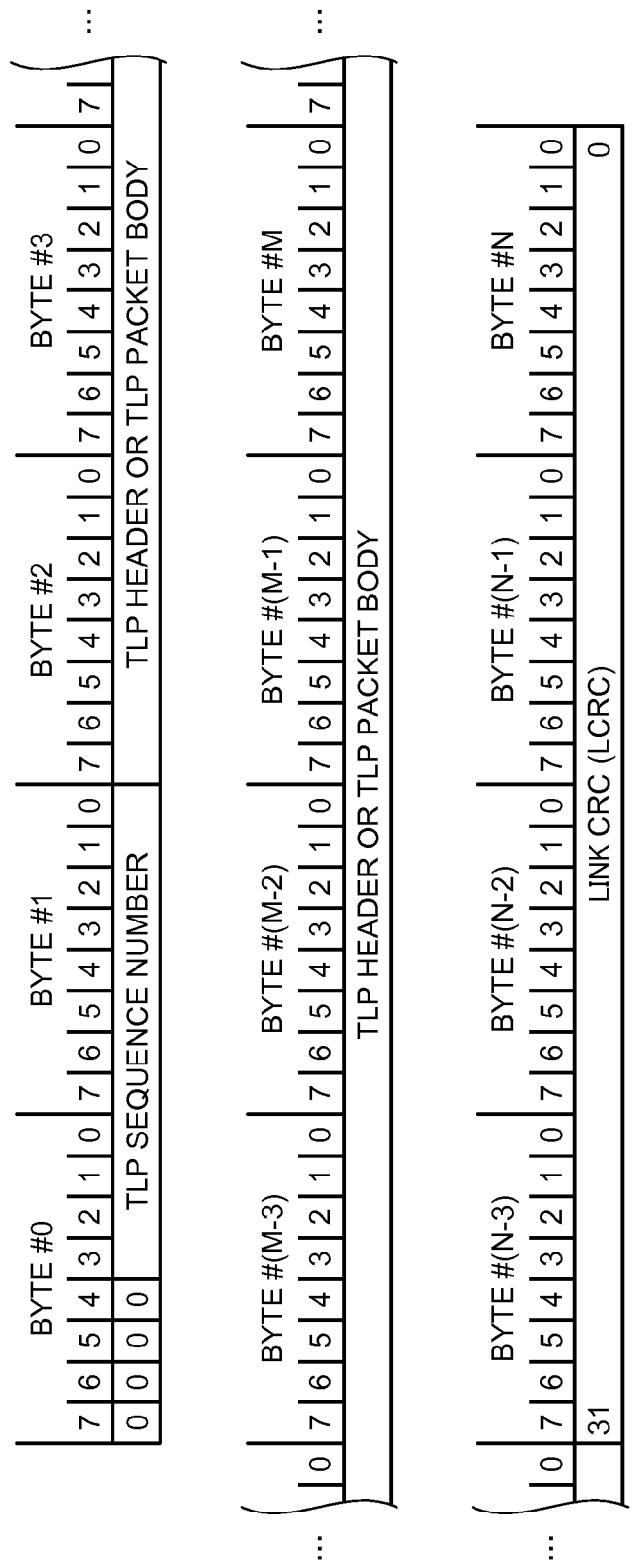
FIG. 32 is a diagram for explaining an example of packets in the related art.

Next, transmission target data stored in the data transmission buffer 78 will be explained using FIG. 32. FIG. 32 is a diagram for explaining an example of packets in the related art. Here, FIG. 32 illustrates an example of packets which the data transmission buffer 78 receives from a data link layer.

For example, a packet received by the data transmission buffer 78 is a packet of N+1 bytes including Byte #0 to Byte #N, which is referred to as "TLP" (Transaction Layer Packet). To be more specific, a packet received by the data transmission buffer 78 denotes a packet in which a TLP sequence number and a TLP header are attached to a TLP packet body in the data link layer. Also, 32-bit link CRC (Cyclic Redundancy Check) is attached to the packet to check an error caused at the time of packet transmission, and therefore it is possible to detect consecutive errors (i.e. burst errors) equal to or below 32 bits.

Next, K characters generated by the control character generation unit 79 will be explained using FIG. 33. FIG. 33 is a diagram for explaining an example of K characters. Here, a code illustrated in FIG. 33 denotes the code uniquely indicating each K character. For example, the control character generation unit 79 generates a "COM" (Comma) symbol to initialize and manage a lane and link, or generates an "STP" (Start TLP) symbol indicating a start of transaction, layer and packet. The control character generation unit 79 outputs the generated "COM" symbol or the "STP" symbol to the byte striping circuit 80.

Figure 34:
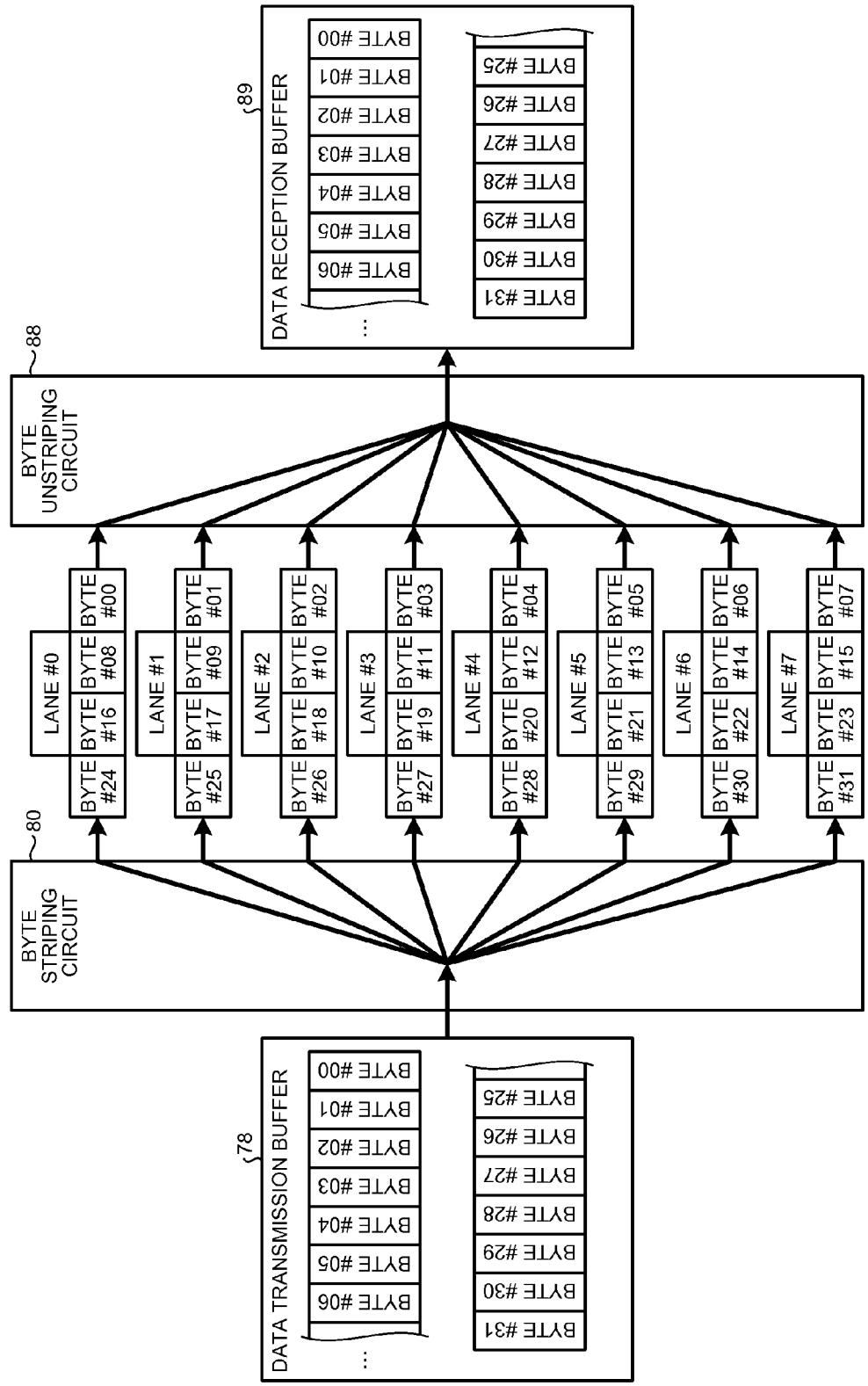
FIG. 34 is a diagram for explaining an example of processing performed in a byte striping circuit.

Next, processing performed in the byte striping circuit 80 and the byte unstriping circuit 88 will be explained using FIG. 34. FIG. 34 is a diagram for explaining an example of processing performed in the byte striping circuit. Here, FIG. 34 illustrates processing of sorting 32-byte data from Byte #00 to Byte #31 into eight lanes #0 to #7 in the byte striping circuit 80.

For example, as illustrated in FIG. 34, the byte striping circuit 80 sorts data, which is output from the data transmission buffer 78, into each lane by one byte each in round-robin fashion. As a result, for example, the byte striping circuit 80 sorts Byte #00, Byte #08, Byte #16 and Byte #24 into lane #0.

Also, the byte unstriping circuit 88 causes data, which the reception circuits 85 to 87 each receive via lanes #0 to #7, to be rearranged in the original order, and, after that, outputs the data rearranged in the original order to the data reception buffer 89. As a result, the data reception buffer 89 receives data transmitted from the data transmission buffer 78.

Figures 35, 36:
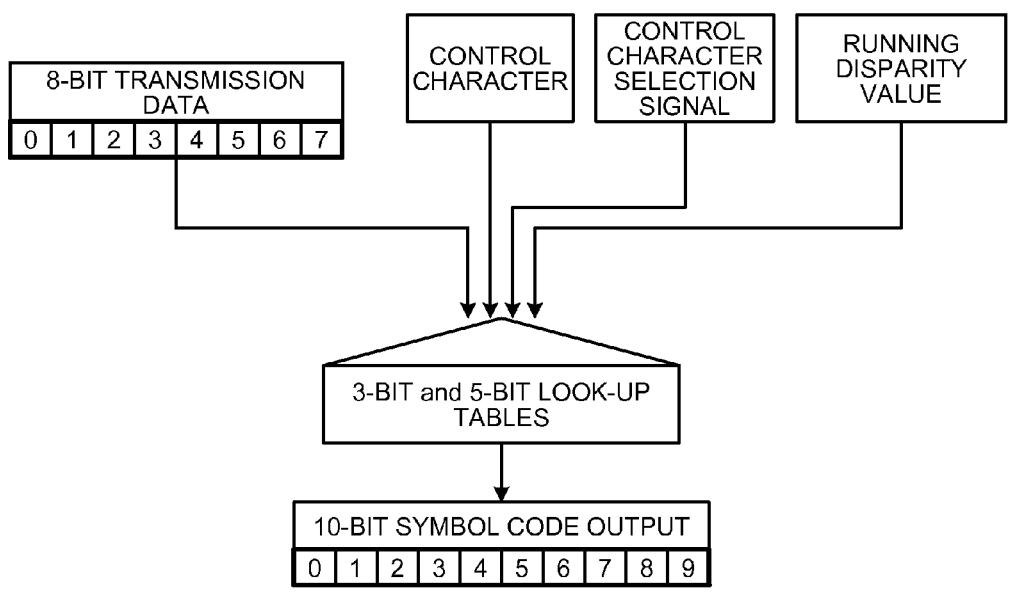
FIG. 35 is a diagram for explaining a principle of an 8B/10B conversion circuit.
FIG. 36 is a diagram for explaining an example of 8B/10B code conversion.

Next, processing of converting 8-bit data into 10-bit data in the 8B/10B encoder 81*b* will be explained using FIG. 35. FIG. 35 is a diagram for explaining a principle of an 8B/10B conversion circuit. For example, as illustrated in FIG. 35, the 8B/10B encoder 81*b* includes a 3-bit look-up table to convert 3-bit data into 4 bits and a look-up table to convert 5-bit data into 6-bit data.

The 8B/10B encoder 81*b* converts an 8-bit D character or K-character into 10-bit data using the look-up tables and outputs the converted data as a 10-bit symbol code. Also, when a control character control signal is input, the 8B/10B encoder 81*b* converts a control character generated by the control character generation unit 79 into a 10-bit symbol code using the look-up tables. Also, the 8B/10B encoder 81*b* outputs respective symbol codes according to running disparity values.

FIG. 36 is a diagram for explaining an example of 8B/10B code conversion. As illustrated in FIG. 36, the 8B/10B encoder 81*b* converts 8-bit transmission data into 10-bit data according to a running disparity value. Here, FIG. 36 illustrates a code assigned to 10-bit data output by the 8B/10B encoder 81*b*, as a data character name.

Also, FIG. 36 illustrates a hexadecimal value of 8-bit data before conversion and 8-bit data before conversion, as a data character value. Also, in the example illustrated in FIG. 36, 8-bit data is described in order of transmission from the right. Also, FIG. 36 illustrates into what data each data character is converted in cases where the running disparity is positive and where the running disparity is negative. For example, in the example illustrated in FIG. 36, in a case where the running disparity is negative, the 8B/10B encoder 81*b* converts 8 bit data character value "6C" into "00_1101_1100."

As described above, the data transmission side LSI 77 sorts transmission data into lanes #0 to #7 using the byte striping circuit 80. The data transmission side LSI 77 converts 8-bit data or K character into a 10-bit symbol code and transmits the 10-bit data to the data reception side LSI 84.

However, the data transmission side LSI 77 converts the 8-bit data into the 10-bit data and transmits the 10-bit data, and therefore the transmission efficiency degrades. Also, the data transmission side LSI 77 performs data conversion using a look-up table, and therefore the delay time caused at the time of data transmission increases.

Also, the data transmission side LSI 77 performs 8B/10B conversion on the data sorted into lanes #0 to #7 by byte striping processing, and transmits the results to the data reception side LSI 84. Therefore, in a case where a burst error occurs in one lane, the data reception side LSI 84 might not detect an error.

Figure 37:
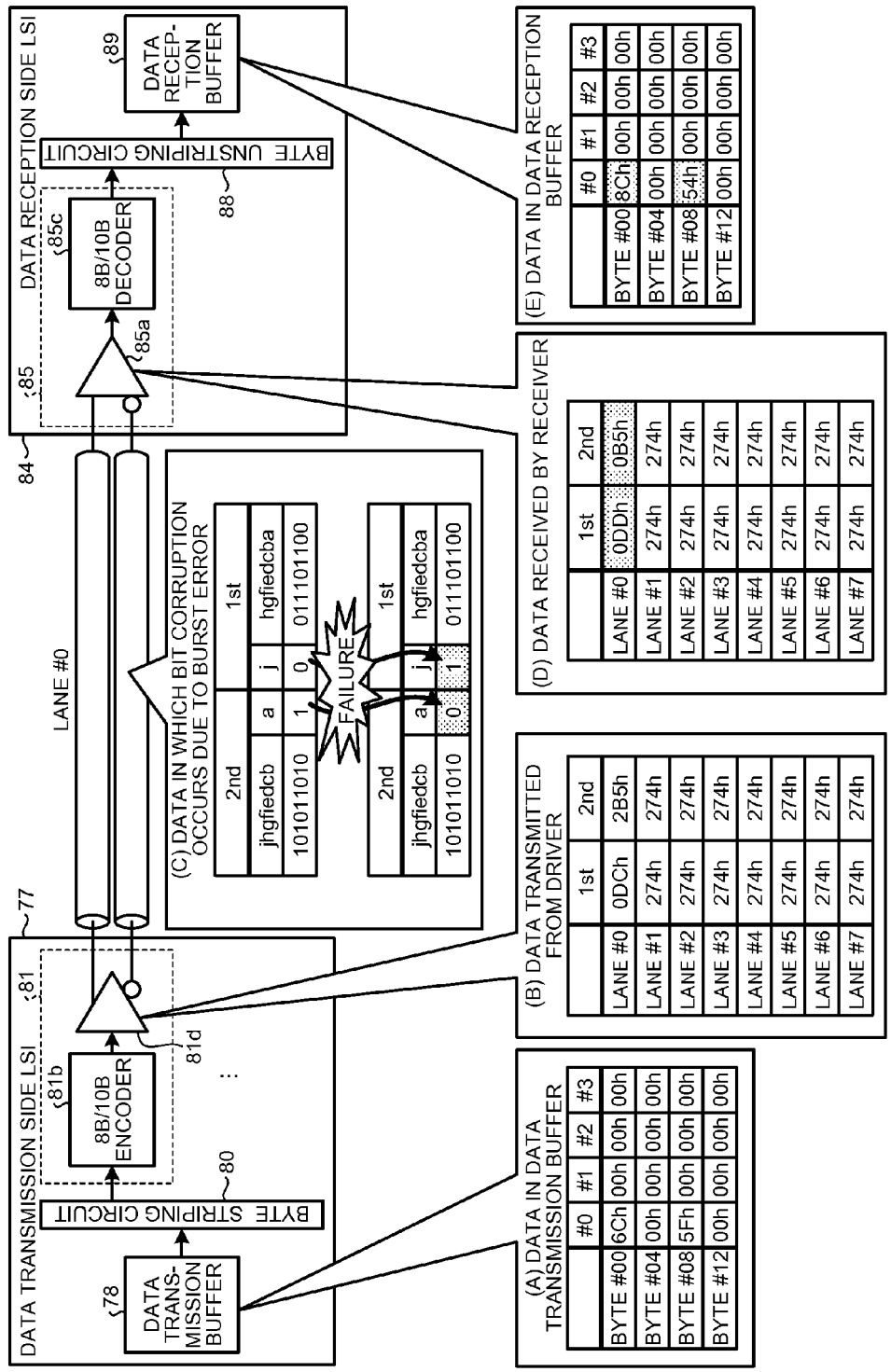
FIG. 37 is a diagram for explaining bit corruption at the time a burst error occurs.

In the following, an example will be explained using the drawings, where it is not possible to detect an error when a burst error occurs in one lane. FIG. 37 is a diagram for explaining bit corruption at the time a burst error occurs. For example, as illustrated in (A) in FIG. 37, the data transmission side LSI 77 processes hexadecimal data "6C, 00, 00, 00, 00, 00, 00, 00, 5F, 00, 00, 00, 00, 00, 00, 00" as a transmission target.

Subsequently, the data transmission side LSI 77 performs byte striping of the data using the byte striping circuit 80 and converts the data into 10-bit data using the 8B/10B encoder 81*b*. As a result, in a case where the running disparity is negative, as illustrated in (B) in FIG. 37, the driver 81*d* transmits character "0DC" and outputs character "2B5."

Here, as illustrated in (C) in FIG. 37, it is assumed that a burst error occurs in lane #0 and the last bit of the first character transmitted by the driver 81*d* and the first bit of the next-transmitted character are reversed. Subsequently, as illustrated in (D) in FIG. 37, the receiver 85*a* receives character "0DD" and receives character "0B5" next.

The 8B/10B decoder 85*c* converts characters "0DD" and "0B5" received by the receiver 85*a* into 8-bit data. Subsequently, the byte unstriping circuit 88 rearranges the data received in lanes #0 to #7 in the original order and outputs the result to the data reception buffer 89. As a result, the data reception buffer 89 receives "8C, 00, 00, 00, 00, 00, 00, 00, 54, 00, 00, 00, 00, 00, 00, 00" as illustrated in (E) in FIG. 37.

Here, FIG. 38 is a diagram for explaining error data in a case where a burst error occurs. Also, FIG. 38 illustrates data transmitted by the data transmission buffer 78 illustrated in FIG. 37 and data received by the data reception buffer 89. As illustrated in the hatching in FIG. 38, the data reception buffer 89 receives data in which an error occurs in Byte #00 and Byte #08.

Subsequently, the data reception side LSI 84 regards parts from the first part in which bit data is inconsistent in Byte #00 to the last part in which bit data is inconsistent in Byte #08, as abnormal data. Therefore, as illustrated in (F) in FIG. 38, the data received in the data reception buffer 89 includes abnormal data of a 63-bit length. Subsequently, there is a case where it is difficult for the data reception side LSI 84 to detect the error illustrated in (F) in FIG. 38 by 32-bit LCRC included in the packet transmitted by the data transmission side LSI 77.

Also, in FIG. 37 and FIG. 38, an example has been described where a 2-bit burst error causes abnormal data of a 63-bit length in serial transmission via eight lanes. However, in a case where there are more lanes, bits in more distant positions are assigned to each lane, and therefore a bit length of a part regarded as abnormity becomes longer in data subjected to byte unstriping processing. As a result, it is difficult for the data reception side LSI 84 to detect an error.

According to one aspect of a technique disclosed in the present embodiment, it is possible to improve the efficiency of serial transmission. Also, according to one aspect of the technique disclosed in the present embodiment, it is possible to detect a burst error caused on a transmission path.

Figure 1:
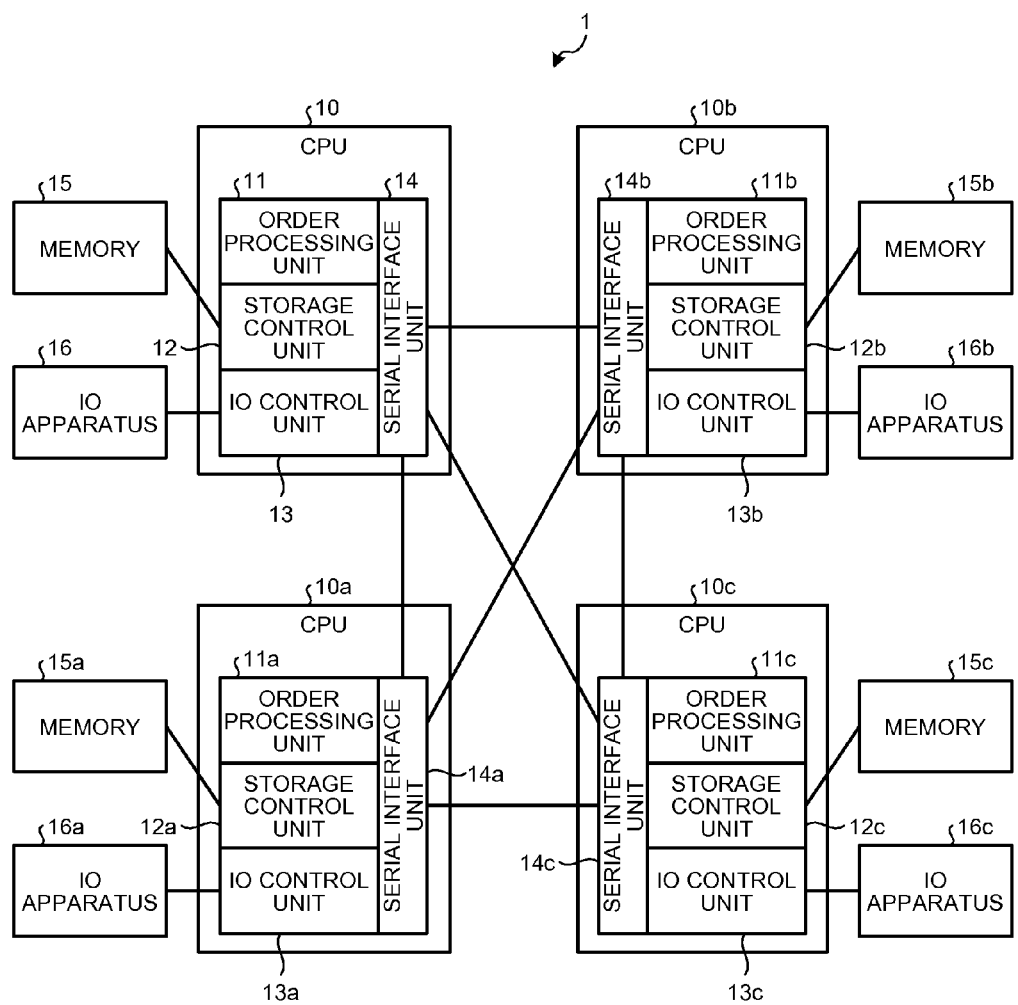
FIG. 1 is a diagram for explaining an example of an information processing system according to a first embodiment.

Next, an example of an information processing system including a data transmission system according to an aspect of the present invention will be explained using the drawings. FIG. 1 is a diagram for explaining an example of an information processing system according to the first embodiment. As illustrated in FIG. 1, an information processing system 1 includes a plurality of CPUs (Central Processing Units) 10 to 10c, a plurality of memories 15 to 15c and a plurality of IO (Input Output) apparatuses 16 to 16c.

Also, each of the CPUs 10 to 10c has an object to improve the processing capacity of the information processing system 1 and adopts a technique such as ccNUMA (Cash Coherence Non-Uniform Memory Access). Also, in the example illustrated in FIG. 1, although the information processing system 1 includes four CPUs 10 to 10c, the present embodiment is not limited to this but can include an arbitrary number of CPUs.

The memory 15 and the IO apparatus 16 are connected to the CPU 10, and the memory 15a and the IO apparatus 16a are connected to the CPU 10a. Also, the memory 15b and the IO apparatus 16b are connected to the CPU 10b, and the memory 15c and the IO apparatus 16c are connected to the CPU 10c.

Also, the CPU 10 includes an order processing unit 11, a storage control unit 12, an IO control unit 13 and a serial interface unit 14. Also, similar to the CPU 10, the CPU 10a includes an order processing unit 11a, a storage control unit 12a, an IO control unit 13a and a serial interface unit 14a. Also, similar to the CPU 10, the CPU 10b includes an order processing unit 11b, a storage control unit 12b, an IO control unit 13b and a serial interface unit 14b. Also, similar to the CPU 10, the CPU 10c includes an order processing unit 11c, a storage control unit 12c, an IO control unit 13c and a serial interface unit 14c.

Here, the serial interface units 14 to 14c each are mutually connected by serial transmission paths and transmit and receive data via the serial transmission paths. Also, in the example illustrated in FIG. 1, although the CPUs 10 to 10c are mutually connected by the serial transmission paths, the present embodiment is not limited to this but can be connected in a phased manner by a crossbar apparatus, for example. Also, it is assumed that the CPUs 10a to 10c each fulfill the similar function to that of the CPU 10, and therefore their explanation will be omitted below.

The order processing unit 11 denotes a processing unit to perform various kinds of computation processing, and, for example, includes a plurality of cores to perform the computation processing using data stored in the memory 15. The storage control unit 12 denotes a control unit to perform control of the data stored in the memory 15 and has a memory controller function and a function of holding a cache coherency. The IO control unit 13 accesses the IO apparatus.

Figure 2:
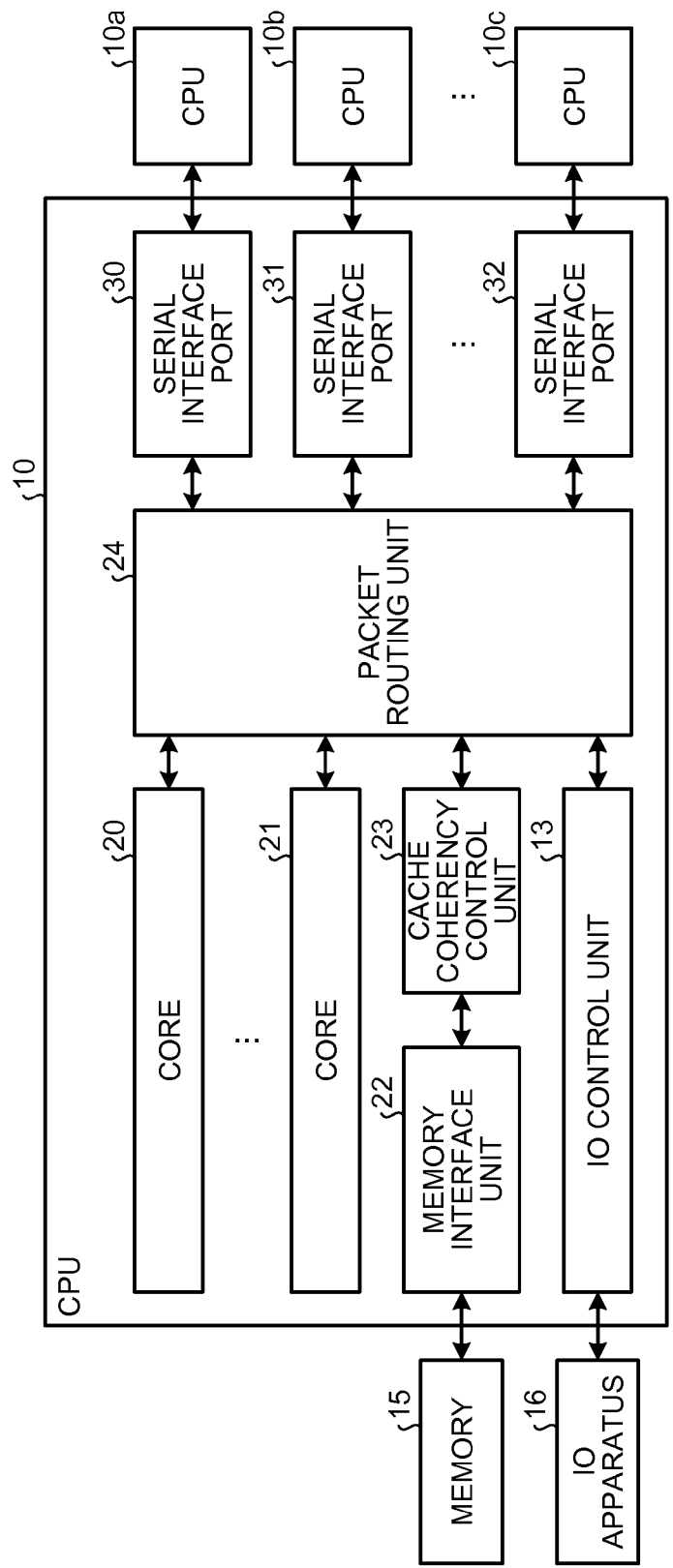
FIG. 2 is a diagram for explaining a functional configuration of a CPU according to the first embodiment.

Next, a functional configuration of the CPU 10 will be explained using FIG. 2. FIG. 2 is a diagram for explaining the functional configuration of the CPU according to the first embodiment. As illustrated in FIG. 2, the CPU 10 includes a plurality of cores 20 and 21, a memory interface unit 22, a cache coherency control unit 23, a packet routing unit 24 and a plurality of serial interface ports 30 to 32.

Here, the cores 20 and 21 are included in the order processing unit 11 illustrated in FIG. 1, and the memory interface unit 22 and the cache coherency control unit 23 are included in the storage control unit 12 illustrated in FIG. 1. Also, the packet routing unit 24 and the plurality of serial interface ports 30 to 32 are included in the serial interface unit 14 illustrated in FIG. 1.

Also, the serial interface port 30 is connected to the CPU 10a, the serial interface port 31 is connected to the CPU 10b, and the serial interface port 32 is connected to the CPU 10c. Also, in the example illustrated in FIG. 2, although other cores than the cores 20 and 21 are omitted to be illustrated, but the CPU 10 can have an arbitrary number of cores. Also, in the example illustrated in FIG. 2, other serial interface ports than the serial interface ports 30 to 32 are omitted to be illustrated, but the CPU 10 can have an arbitrary number of serial interface ports.

The cores 20 and 21 denote cores to perform various kinds of computation processing. For example, the core 20 has a cache function, caches data stored in the memory 15 via the packet routing unit 24, the cache coherency control unit 23 and the memory interface unit 22, and performs computation processing using the cached data.

The memory interface unit 22 denotes a control unit to perform memory access. For example, it denotes a memory access apparatus. The cache coherency control unit 23 performs processing of maintaining the uniformity between the data stored in the memory 15 and data cached in the core 20, the core 21 or the other CPUs 10a to 10c. For example, the cache coherency control unit 23 performs processing of maintaining the coherence of cache data using a method such as an Illinois protocol and ccNUMA.

The packet routing unit 24 relays packets that are mutually switched between the core 20, the core 21, the cache coherency control unit 23, the IO control unit 13 and the serial interface ports 30 to 32. The serial interface ports 30 to 32 denote ports that are connected to the CPUs 10a to 10c, respectively, to perform serial transmission with the CPUs 10a to 10c via serial transmission paths.

In the following, processing performed in each of the serial interface ports 30 to 32 will be explained. Also, in the following explanation, the serial interface ports 31 and 32 fulfill the similar function to that of the serial interface port 30, and therefore their explanation will be omitted below.

Figure 3:
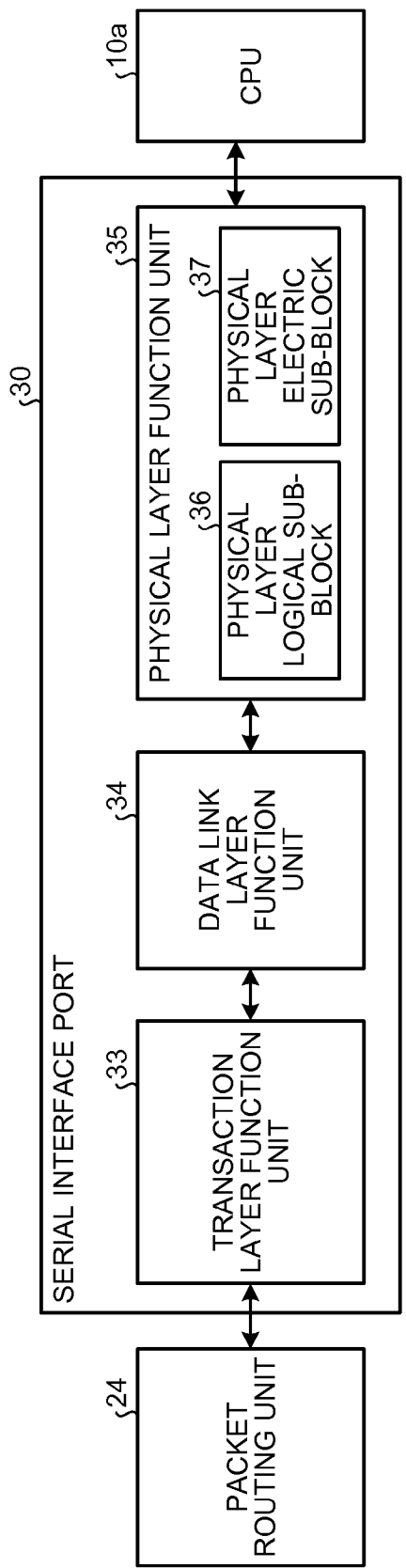
FIG. 3 is a diagram for explaining a functional configuration of a serial interface port according to the first embodiment.

FIG. 3 is a diagram for explaining a functional configuration of the serial interface port according to the first embodiment. In the example illustrated in FIG. 3, the serial interface port 30 includes a transaction layer function unit 33, a data link layer function unit 34 and a physical layer function unit 35. Also, the physical layer function unit 35 includes a physical layer logical sub-block 36 and a physical layer electric sub-block 37.

The transaction layer function unit 33 has a transaction layer packet generation function, a VC (Virtual Channel) management function and a data flow control function by VC credit. For example, when receiving from the packet routing unit 24 a packet transmitted toward the CPU 10a, the transaction layer function unit 33 generates a transaction layer packet from the received packet and outputs the generated packet to the data link layer function unit 34.

The data link layer function unit 34 has a packet delivery control function with a remote component connected via a physical layer, a DLLP (Data Link Layer Packet) generation function and a DLLP decipherment function. Further, the data link layer function unit 34 has a data retransmission function by a retry buffer, a data flow control function by ACK or NACK, a generation function of a CRC corresponding to a redundancy bit and an error detection function using a CRC.

For example, when receiving from the transaction layer function unit 33 a packet transmitted toward the CPU 10*a*, the data link layer function unit 34 generates a DLLP from the received packet. Also, the data link layer function unit 34 generates a CRC to detect an error from the generated DLLP and attaches the generated CRC to the DLLP. Further, the data link layer function unit 34 outputs the DLLP with the CRC to the physical layer function unit 35.

Here, an example of a packet generated in the data link layer function unit 34 will be explained using FIG. 4 and FIG. 5. FIG. 4 is a diagram for explaining a packet in a data link layer. As illustrated in FIG. 4, the data link layer function unit 34 generates a 76-bit packet from bit #0 to bit #75. Here, bits #74 and #75 of the packet generated in the data link layer function unit 34 are a field to store tags T1 and T0 and stores a 2-bit control code.

Also, bits #73 to #10 of the packet generated in the data link layer function unit 34 are a field to store payloads D63 to D00 and stores an 8-byte payload. Also, bits #9 to #0 of the packet generated in the data link layer function unit 34 are a field to store CRCs C9 to C0 and stores a 10-bit CRC. With this 10-bit CRC, it is possible to detect a maximum 10-bit burst error.

Here, the 2-bit control code signal stored in tags T1 to T0 denotes a signal indicating the attribute of 8-byte payload data D63 to D00. The CPUs 10 to 10*c* realize a K character function using the control code signal stored in tags T1 and T0 and part of the bits of payload data D63 to D00.

FIG. 5 is a diagram for explaining packet formats in a data link layer. Also, FIG. 5 illustrates an example of data stored in tags T1 and T0 and data stored in payloads D63 to 00. For example, in the case of "00" in tags T0 and T1, packets instead of various K characters are issued.

For example, in a case where "0" is stored in all of payloads D63 to 00, that is, a packet with all 0's denotes a packet called "PAD." This PAD denotes a packet, which is used instead of the K character PAD illustrated in FIG. 33 and which is used at the logical idle time, and indicates that there is no data to be issued as a data link layer.

Also, in a case where payload D63 is "0" and payload D62 is "1," a packet called "DLLP" is given in which a 62-bit payload is stored in D61 to D00. This DLLP denotes a packet which is used instead of a K character SDP illustrated in FIG. 33 and which indicates an issue of a data link layer packet. Also, the DLLP payload necessarily has a 62-bit size.

Also, in a case where payload D63 is "1" and D62 is "0," a packet called "STP" is given in which a 62-bit payload is stored in D61 to D00. This STP denotes a packet which is used instead of a K character STP illustrated in FIG. 33 and which indicates a start of a transaction layer packet. Also, the STP payload necessarily includes a header part and indicates that packets are continuously transmitted.

Meanwhile, in the case of "01" in tags T1 and T0, the following data is given. For example, in a case where payload D63 is "0" and D62 is "0," a packet called "MKUE" is given in which a 62-bit payload is stored in D61 to D00. This MKUE indicates that a packet stored in payloads D1 and 00 is Marked-UE data. Also, a unit number to detect an uncorrectable error is inserted in a specific position of the MKUE payload, which indicates that packets are continuously transmitted.

Meanwhile, in a case where payload D63 is "0" and D62 is "1," a packet called "MKUEE" is given in which a 62-bit payload is stored in D61 to D00. This MKUEE denotes a packet in which the similar information to that of the MKUE is stored, and indicates that a subsequent packet is not present and transmission of a packet (i.e. MKUE) storing the similar information is normally ended.

Also, a packet with "1" in payloads D63 and D62 denotes a packet called "EDB" storing invalid data in D61 to D00 (i.e. all 0's). This EDB denotes a packet which is used instead of a K character EDB illustrated in FIG. 33 and which indicates an abnormal end of a transaction layer packet (TLP).

Also, a packet with "10" in tags T1 and T0 denotes a packet called "DATA" including a 64-bit payload in D63 to D00. This DATA denotes an 8-byte data packet transmitted secondarily or subsequently in a PLP (Protocol Layer Packet) or a CMD (command), and indicates that similar packets are subsequently consecutive. Also, information indicating what byte of data is included in the DATA, is stored in a packet header.

Also, a packet storing "11" in tags T1 and T0 denotes a packet called "END" including a 64-bit payload in D63 to D00. This END denotes an 8-byte data packet transmitted secondarily or subsequently in a protocol layer packet or a CMD (command), and indicates that transmission of a packet storing the similar information is normally ended.

Also, in the example illustrated in FIG. 5, a packet with "1" in payloads D63 and D62 is not used and set as a spare packet. Also, in the example illustrated in FIG. 5, a packet with "1" in payload D63 and "0" in D62 is not used and set as a spare packet.

Referring back to FIG. 3, the physical layer function unit 35 has an initialization state machine function, a lane configuration control function, a byte order generation function, a byte order regeneration function, a scrambling function, a descrambling function, a code conversion function and a K character generation function. Further, the physical layer function unit 35 has an elastic buffer, a clock generation function, a clock regeneration function, a parallel-to-serial conversion function, a serial-to-parallel conversion function, a transmission circuit of a differential transmission path and a reception circuit of an operation transmission path including an equalizer.

Figure 6:
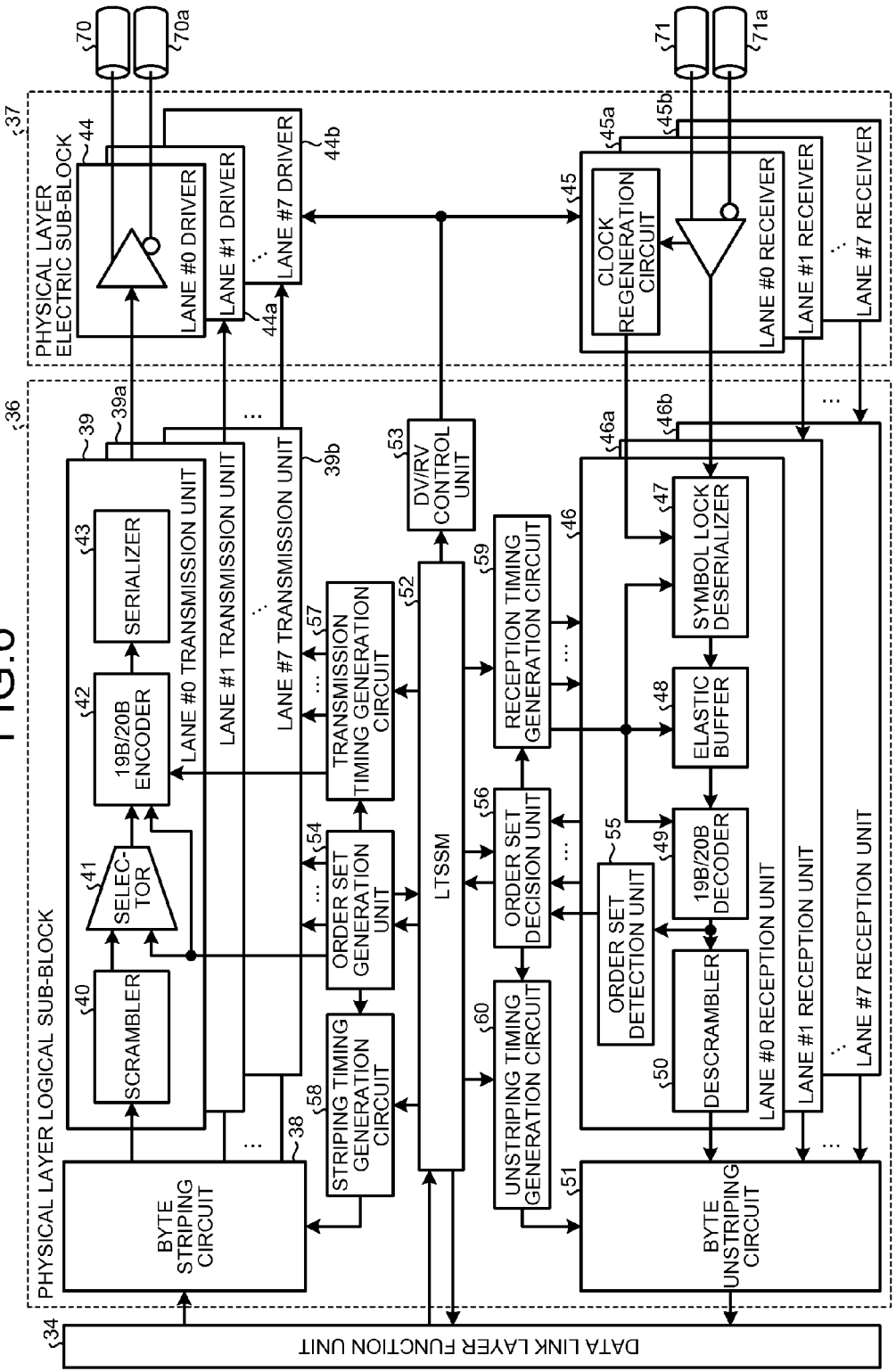
FIG. 6 is a diagram for explaining a functional configuration of a physical layer function unit according to the first embodiment.

In the following, functions held in the physical layer function unit 35 will be explained using FIG. 6. FIG. 6 is a diagram for explaining a functional configuration of the physical layer function unit according to the first embodiment. In the example illustrated in FIG. 6, the physical layer logical sub-block 36 of the physical layer function unit 35 includes a byte striping circuit 38, lane #0 transmission unit 39 to lane #7 transmission unit 39*b*, lane #0 reception unit 46 to lane #7 reception unit 46*b* and a byte unstriping circuit 51.

Also, the physical layer logical sub-block 36 includes an LTSSM (Link Training and Status State Machine) 52, a DV/RV (Driver/Receiver) control unit 53, an order set generation unit 54 and an order set decision unit 56. Also, the physical layer logical sub-block 36 includes a transmission timing generation circuit 57, a striping timing generation circuit 58, a reception timing generation circuit 59 and an unstriping timing generation circuit 60.

Also, the lane #0 transmission unit 39 includes a scrambler 40, a selector 41, a 19B/20B encoder 42 and a serializer 43. Also, the lane #0 reception unit 46 includes a symbol lock deserializer 47, an elastic buffer 48, a 19B/20B decoder 49, a descrambler 50 and an order set detection unit 55.

Also, it is assumed that the lane #1 transmission unit 39*a* to the lane #7 transmission unit 39*b* fulfill the similar function to that of the lane #0 transmission unit 39, and therefore their explanation will be omitted. Also, it is assumed that the lane #1 reception unit 46*a* to the lane #7 reception unit 46*b* fulfill the same function to that of the lane #0 reception unit 46, and therefore their explanation will be omitted.

Also, the physical layer electric sub-block 37 includes lane #0 driver 44 to lane #7 driver 44b and lane #0 receiver 45 to lane #7 receiver 45b. Here, these lanes #0 to #7 are differential transmission paths. Also, the drivers 44 to 44b each output serial signals to the lanes #0 to #7 corresponding to differential transmission paths and receive serial signals from the differential transmission paths, so as to perform serial transmission. For example, the driver 44 outputs a serial signal to differential transmission paths 70 and 70a of lane #0 and the receiver 45 receives a serial signal from differential transmission paths 71 and 71a of lane #0, so as to perform serial transmission.

Here, it is assumed that the lane #1 driver 44a to the lane #7 driver 44b fulfill the similar function to that of the lane #0 driver 44, and therefore their explanation will be omitted. Also, the lane #1 receiver 45a to the lane #7 receiver 45b fulfill the similar function to that of the lane #0 receiver 45, and therefore their explanation will be omitted. Also, in the following explanation, after functions on the data transmission side are described, functions on the data reception side are described.

First, the functions on the data transmission side will be explained. The byte striping circuit 38 sorts packet data received from the data link layer function unit 34 into lanes #0 to #7 according to a striping timing signal received from the striping timing generation circuit 58. For example, the byte striping circuit 38 sorts 9-bit data into lanes #0 to #3 and 10-bit data into lanes #4 to #7.

The scrambler 40 denotes a circuit to pseudo-randomize the data sorted by the byte striping circuit 38 into lane #0. That is, the scrambler 40 reduces electromagnetic noise in the circuit by pseudo-randomizing the transmission data. The selector 41 denotes a selection circuit to output the data pseudo-randomized by the scrambler 40 or a K character generated by the order set generation unit 54 (described later) to the 19B/20B encoder 42.

The 19B/20B encoder 42 codes the data acquired from the selector 41. To be more specific, the 19B/20B encoder 42 receives the data from the selector 41 and receives, from the order set generation unit 54, a signal indicating whether the received data is a D character or a K character. Further, the 19B/20B encoder 42 receives, from the transmission timing generation circuit 57, a transmission symbol cycle identification signal to identify whether to output a first symbol or output a second symbol.

Subsequently, the 19B/20B encoder 42 performs following processing according to a received signal. That is, in a case where the signal to identify the first symbol and the second symbol designates the first symbol, when receiving a signal indicating that the data is a D character, the 19B/20B encoder 42 receives 9-bit data from the selector 41. Subsequently, it generates the first symbol by attaching a 1-bit control bit to the 9-bit data. Alternatively, in a case where the signal to identify the first symbol and the second symbol designates the second symbol, the 19B/20B encoder 42 receives 10-bit data from the selector 41. Here, this 10-bit data is processed as is as the second symbol. Subsequently, the 19B/20B encoder 42 outputs the generated first symbol or the second symbol to the serializer 43.

Meanwhile, in a case where the signal to identify the first symbol and the second symbol designates the first symbol, when receiving a signal indicating that the data is a K character, the 19B/20B encoder 42 generates the first symbol by attaching 1-bit control data to the K character and attaching a head bit of the same value as that of the control data to the K character. That is, the first symbol is a D character to which a control bit is attached or a K character to which a control bit is attached. Subsequently, the 10B/20B encoder 42 outputs the generated first symbol to the serializer 43.

Here, in the case of generating the first symbol including the D character, the 19B/20B encoder 42 attaches a control bit of a different value from that of the head bit of the D character. Therefore, the 19B/20B encoder 42 includes at least one bit transition in the first symbol including the D character.

Figure 7:
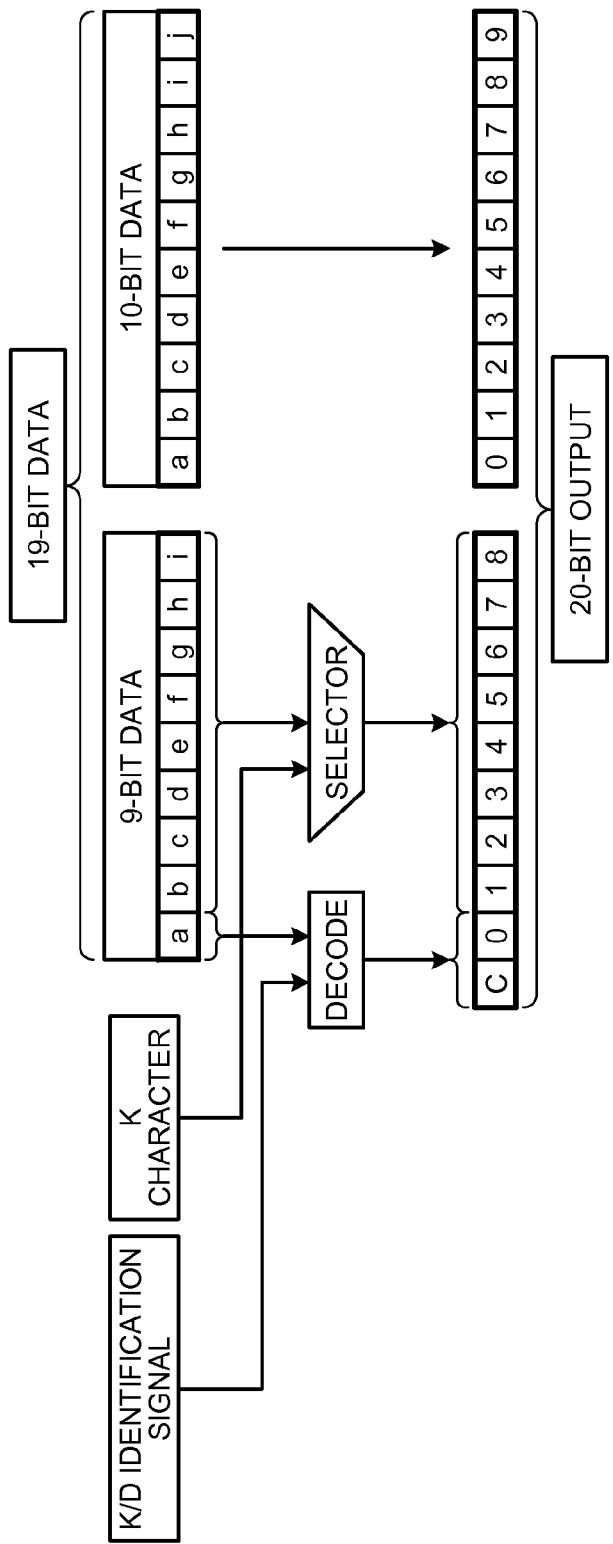
FIG. 7 is a diagram for explaining 19B/20B conversion according to the first embodiment.

For example, FIG. 7 is a diagram for explaining 19B/20B conversion according to the first embodiment. Also, FIG. 7 illustrates the principle of 19B/20B conversion performed by the 19B/20B encoder 42. For example, the 19B/20B encoder 42 receives the D character or the K character from the selector 41. Also, the 19B/20B encoder 42 receives, from the order set generation unit 54, a K/D identification signal indicating whether the data is a K character or the data is a D character.

Subsequently, the 19B/20B encoder 42 divides 19-bit data into 9-bit data (i.e. D character) and 10-bit data, and outputs the 10-bit data as is as a second symbol. Also, the 19B/20B encoder 42 selects the 8-bit K character or the 9-bit D character according to the K/D identification signal.

Also, the 19B/20B encoder 42 decodes the K/D identification signal and the head bit of the D character, that is, the head bit ("a" in FIG. 7) of the 9-bit data, and generates a control bit ("C" in FIG. 7) and the head bit of the D character. To be more specific, in a case where the K/D identification number indicates a D character, the 19B/20B encoder 42 processes a reversal bit of the head bit "a" of the 9-bit data as a control bit and processes the head bit "a" as a bit "0" following the control bit. Subsequently, the 19B/20B encoder 42 generates 10-bit data in which bits "b" to "i" of the 9-bit data are replaced with "1" to "8." Also, the 19B/20B encoder 42 generates 10-bit data in which the 10-bit data among the 19-bit data is processed as is as bits "0" to "9."

Also, in a case where the K/D identification signal indicates a K character, the 19B/20B encoder 42 processes the control bit and the subsequent bit "0" of the 20-bit output as the same bit value. Subsequently, the 19B/20B encoder 42 generates 10-bit data storing K characters in bits "1" to "8."

Subsequently, the 19B/20B encoder 42 outputs the 10-bit data in which the 1-bit control bit is attached to the D character or the 10-bit data in which the 1-bit control bit and the 1-bit head bit are attached to the K character, as a first symbol. That is, the 19B/20B encoder 42 outputs 10-bit data including a 1-bit control bit, as a first symbol.

Here, a relationship between the head two bits and the eight subsequent bits of the first symbol will be explained using FIG. 8. Also, in the following explanation, the head two bits of the first symbol will be explained as a 10-bit symbol code. FIG. 8 is a diagram for explaining a 10-bit symbol code according to the first embodiment. For example, in the case of outputting a D character as the first symbol, the 19B/20B encoder 42 attaches a control bit of a value corresponding to a reversal value of the head bit of the D character.

That is, in a case where the head bit of the D character is "0," the 19B/20B encoder 42 attaches "1" as the control bit. Also, in a case where the head bit of the D character is "1," the 19B/20B encoder 42 attaches "0" as the control bit. Also, in the case of outputting the K character as the first symbol, the 19B/20B encoder 42 attaches control bit "1" and head bit "1."

Also, taking into account the DC balance, as a K character, a value formed with five "0's" and "1's" is selected, except for one kind. Also, among 10 bits of the first symbol, 8 bits except the control bit and the head bit are bits indicating the K character, and therefore maximum 56 ($_8C_3$) kinds of K characters can be expressed. Also, in a case where the control bit is "0" and the head bit is "0," an invalid symbol is given except for the case of all 0's.

Here, FIG. 9 is a diagram for explaining bit codes of K characters according to the first embodiment. The 19B/20B encoder 42 outputs bit code "11_0011_0010" as a first symbol including K character "COM." Here, "COM" denotes a symbol indicating a start of a skip order set (SKPOS) or EIOS (Electrical Idle Ordered State).

Also, the 19B/20B encoder 42 outputs bit code "11_1111_1111" as a first symbol indicating a K character of "LONG1." Here, "LONG1" denotes a symbol indicating a start of a TSOS (Training Ordered Set) and EIEOS (Electrical Idle Exit Ordered Set).

Also, the 19B/20B encoder 42 outputs bit code "00_0000_0000" as a first symbol indicating a K character of "LONG0." Here, "LONG0" denotes a symbol used to generate a low frequency signal in combination with "LONG1" used in a training sequence.

Also, the 19B/20B encoder 42 outputs bit code "11_0101_0100" as a first symbol indicating a K character of "SKP." Here, "SKP" denotes a symbol of an increase/decrease target in skew adjustment, which indicates a skip order set (SKP OS) by following "COM."

Also, the 19B/20B encoder 42 outputs bit code "11_1100_1000" as a first symbol indicating a K character of "IDL." Here, "IDL" denotes a symbol indicating an EIOS by following "COM." Also, other codes than the codes exemplified in FIG. 9 are invalid codes.

Thus, the 19B/20B encoder 42 generates a 10-bit first symbol including a D character and a control bit or including a K character and a control bit, and generates a second symbol including a 10-bit D character. Here, the 19B/20B encoder 42 does not output the first symbol and the second symbol at the same time but generates the first symbol and the second symbol while switching them in a predetermined period. For example, the 19B/20B encoder 42 alternately generates the first symbol and the second symbol.

Figures 10, 11:
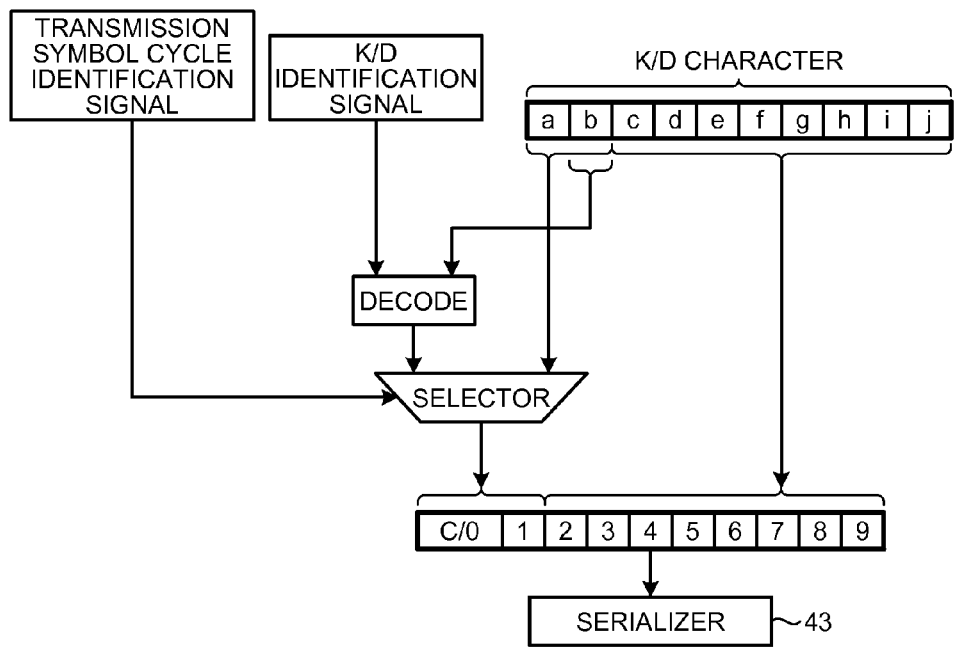
FIG. 10 is a diagram for explaining a specific example of a 19B/20B encoder.
FIG. 11 is a diagram for explaining an operation of a 19B/20B encoder according to the first embodiment.

Next, a specific example of the 19B/20B encoder 42 will be explained using FIG. 10. FIG. 10 is a diagram for explaining a specific example of the 19B/20B encoder. As illustrated in FIG. 10, the 19B/20B encoder 42 receives a K/D identification signal from the order set generation unit 54 and receives a transmission symbol cycle identification signal from the transmission timing generation circuit 57. Also, the 19B/20B encoder 42 receives, from the selector 41, 10-bit data from "a" to "j."

Here, the transmission symbol cycle identification signal denotes a symbol to indicate whether a symbol output in the 19B/20B encoder 42 is a first symbol or the symbol is a second symbol. Also, in the other aspect, the transmission symbol cycle identification signal denotes a signal switched every symbol time for transmitting one symbol in each of lanes #0 to #7. For example, the transmission symbol cycle identification signal indicates whether the number of times to transmit the first symbol including a D character in each of lanes #0 to #7 is an even number or the number is an odd number.

For example, in a case where the transmission symbol cycle identification signal instructs transmission of a second symbol, the 19B/20B encoder 42 processes the received bits "a" to "j" as is as a second symbol. Also, in a case where the transmission symbol cycle identification signal instructs transmission of a first symbol and the K/D identification signal indicates a D character, the 19B/20B encoder 42 performs the following processing. That is, the 19B/20B encoder 42 processes a reversal value of the received bit "b" as the head bit of the first symbol and stores the received bits "b" to "j" as is in the first symbol.

Meanwhile, in a case where the transmission symbol cycle identification signal instructs transmission of a first symbol and the K/D identification signal indicates a D character, the 19B/20B encoder 42 performs the following processing. That is, the 19B/20B encoder 42 processes a K character code supplied from the selector, as is as a first symbol.

Also, as described later, the order set generation unit 54 generates a K character with the head two bits of "00" or "11" as a K character. Therefore, the 19B/20B encoder 42 generates a first symbol in which a control bit reversing the head bit of a D character is attached to the head of the D character, or generates a first symbol in which a control bit corresponding to the head bit of a K character is attached to the head of the K character.

FIG. 11 is a diagram for explaining an operation of the 19B/20B encoder according to the first embodiment. In the example illustrated in FIG. 11, in the case of instructing transmission of a second symbol, the transmission symbol cycle identification signal is "1," and, in the case of instructing transmission of a first symbol, the transmission symbol cycle identification signal is "0." Also, in the example illustrated in FIG. 11, in the case of indicating a D character, the K/D identification signal is "0," and, in the case of indicating a K character, the K/D identification signal is "1."

As a result, in the example illustrated in FIG. 11, in a case where the transmission symbol cycle identification signal is "1," the 19B/20B encoder 42 stores bits "a" to "j" received from the selector 41 in the symbol. Also, in a case where the transmission symbol cycle identification signal is "0" and the K/D identification signal is "0," the 19B/20B encoder 42 stores reversal bit "^b" of bit "b" received from the selector 41 in head bit "0" of the symbol and stores bits "b" to "j" in other bits "1" to "9." Also, in a case where the transmission symbol cycle identification signal is "0" and the K/D identification signal is "1," the 19B/20B encoder 42 stores "00" or "11" in head bits "0" and "1" in the symbol and stores code values of the K character in other bits "2" to "9."

Returning to FIG. 6, the serializer 43 receives a first symbol or a second symbol as 10-bit parallel data from the 19B/20B encoder 42. Subsequently, the serializer 43 converts the received first symbol or second symbol into serial data every symbol time, and outputs the converted serial data to the lane #0 driver 44.

Here, the symbol time denotes time for transmitting one symbol, and, to be more specific, denotes time for the lane #0 driver 44 to perform serial transmission of 10-bit data via the differential transmission paths 70 and 70a. When receiving the serial data from the serializer 43, the lane #0 driver 44 outputs the received data to the differential transmission paths 70 and 70a, that is, outputs the received data to lane #0 to transmit the received data to the facing CPU 10a.

Here, the transmission timing generation circuit 57 (described later) switches a transmission symbol cycle identification signal, which is supplied to the transmission units 39 to 39b of lanes #0 to #7, in a predetermined period. Also, the transmission timing generation circuit 57 outputs to at least one transmission unit a transmission symbol cycle identification signal to instruct transmission of a first symbol, and outputs to the other transmission units a transmission symbol cycle identification signal to instruct transmission of a second symbol.

Therefore, for example, in certain symbol time, the transmission units of lanes #0 to #3 output a first symbol and the transmission units of lanes #4 to #7 output a second symbol.

Also, in the next symbol time, the transmission units of lanes #0 to #3 output a second symbol and the transmission units of lanes #4 to #7 output a first symbol.

In the following, symbols output to lanes #0 to #7 will be explained using FIG. 12 and FIG. 13. Also, in the following explanation, it is assumed that the symbol time at which the first symbol is output to lanes #0 to #3 is an even-number cycle and the symbol time at which the first symbol is output to lanes #4 to #7 is an odd-number cycle.

FIG. 12 is a diagram for explaining data output to lanes #0 to #7 at the time of the even-number cycle. Also, FIG. 13 is a diagram for explaining data output to lanes #0 to #7 at the time of the odd-number cycle. Also, the examples illustrated in FIG. 12 and FIG. 13 illustrate data output from the transmission units 39 to 39b to lanes #0 to #7 when the byte striping circuit 38 sorts the packet illustrated in FIG. 4 into lanes #0 to #7 by one byte each. That is, FIG. 12 and FIG. 13 illustrate how T1 to T0, D63 to D00 and C9 to C0 of the packet illustrated in FIG. 4 are sorted into each lane.

In the example illustrated in FIG. 12, the byte striping circuit 38 sorts nine bits at a time from the head of T1 to T0, D63 to D00 and C9 to C0 except for Control Bit (Ctrl) into lanes #0 to #3 and subsequently sorts ten bits at a time into lanes #4 to #7. Therefore, the transmission units of lanes #0 to #3 use a first symbol acquired by attaching a 1-bit Ctrl to 9-bit data, as a first symbol. Also, the transmission units of lanes #4 to #7 use 10-bit data as is as a second symbol.

Therefore, lanes #0 to #3 transmit a first symbol including 9-bit data and 1-bit control bit, and lanes #4 to #7 transmit a second symbol including 10-bit data.

Also, in the example illustrated in FIG. 13, the byte striping circuit 38 sorts nine bits at a time from the head of T1 to T0, D63 to D00 and C9 to C0 except for Ctrl into lanes #7 to #4 and subsequently sorts ten bits at a time into lanes #3 to #0. That is, the byte striping circuit 38 performs the sort with respect to lanes #0 to #7 in a reverse order between at the time of the even-number cycle and at the time of the odd-number cycle. Therefore, lanes #0 to #3 transmit a second symbol including 10-bit data, and lanes #4 to #7 transmit a first symbol including 9-bit data and 1-bit control bit.

Also, the drivers 44 to 44b of lanes #0 to #7 transmit the data illustrated in FIG. 12 and FIG. 13 to the CPU 10a in order from bit "0." For example, the lane #0 driver 44 transmits data in order from Ctrl, D57 to D63, T0 to T1 at the time of the even-number cycle. Also, the lane #0 driver 44 transmits data in order from C0 to C9 at the time of the odd-number cycle.

Thus, the transmission units 39 to 39b each transmit the bits illustrated in FIG. 12 and the bits illustrated in FIG. 13 in an alternate manner via lanes #0 to #7. Therefore, in the facing CPU 10, one bit transition is necessarily included in data received via lanes #0 to #7 once in 20 bits, and therefore it is possible to easily perform clock regeneration.

Here, FIG. 14 is a diagram for explaining the order of first symbols output by lanes #0 to #7 according to the first embodiment. As illustrated in FIG. 14, lanes #0 to #3 are classified into the first group and lanes #4 to #7 are classified into the second group. Here, lanes #0 to #3 transmit a first symbol at the time of the even-number cycle and lanes #4 to #7 transmit a first symbol at the time of the odd-number cycle.

Here, in a case where a D character is stored in the first symbol, a control bit reversing the head bit of the D character is attached, and therefore bit value transition is necessarily included in the first symbol. Therefore, in a case where lanes #0 to #7 transmit a D character, bit value transition is necessarily included once in 20 bits. Therefore, without 8B/10B conversion, the transmission units 39 to 39b each can easily cause the CPU 10a to perform clock regeneration.

Also, the transmission units 39 to 39b each convert 19-bit data into 20 bits and transmit the result. As a result, the transmission units 39 to 39b each can efficiently perform serial transmission without wasting a transmission path band. Also, the transmission units 39 to 39b each store an arbitrary K character in a first symbol and therefore can perform various kinds of control implemented when performing serial transmission.

Also, as illustrated in FIG. 12 and FIG. 13, the transmission units 39 to 39b each transmit a 10-bit CRC in at least one lane. Here, as illustrated in FIG. 12 and FIG. 13, the transmission units 39 to 39b each transmit one packet received from the data link layer function unit 34 at the identical symbol time.

Here, a CRC transmitted in any one lane by the transmission units 39 to 39b denotes a CRC that can detect 10-bit data from data transmitted at the identical symbol time. Also, the transmission units 39 to 39b each output maximum 10-bit data in one symbol time. As a result, even if a burst error occurs in any lane and all bits corrupt, that is, bit corruption occurs in 10 bits in a consecutive manner, the CPU 10a on the reception side can detect an error using the CRC transmitted at the identical symbol time.

Next, functions on the data reception side will be explained. The lane #0 receiver 45 receives serial data from the facing CPU 10a via the differential transmission paths 71 and 71a. Subsequently, the lane #0 receiver 45 converts the received data into a bit data sequence. Also, with the clock generation circuit, the receiver 45 generates a reception clock using the bit transition timing of transmission data as a reference. Also, the lane #0 receiver 45 outputs the converted bit data sequence and the clock regenerated in the clock regeneration circuit, to the symbol lock deserializer 47.

Here, the lane #0 receiver 45 generates the clock using bit transition included in the first symbol transmitted from the CPU 10a. Also, as described above, the 19B/20B encoder 42 includes at least one bit transition in the first symbol containing a D character. Therefore, in a case where the CPU 10a generates a similar symbol to that of the 19B/20B encoder 42, the lane #0 receiver 45 can adequately perform clock regeneration using a control bit included in the first symbol.

The symbol lock deserializer 47 converts the bit sequence received from the lane #0 receiver 45 into 10-bit parallel data. To be more specific, the symbol lock deserializer 47 detects a reference bit at the time of initialization and locks a symbol according to the clock received from the lane #0 receiver 45, and, by the time an initialization is performed again, identifies 10-bit serial data every symbol time. Subsequently, the symbol lock deserializer 47 converts the identified serial data into parallel data and stores the converted parallel data in the elastic buffer 48.

The elastic buffer 48 denotes a buffer for migration into an internal clock. For example, the symbol lock deserializer 47 writes parallel data in the elastic buffer 48 at the clock regenerated by the clock regeneration circuit of the lane #0 receiver 45. Subsequently, the 19B/20B decoder 49 absorbs the clock jitter by reading the parallel data from the elastic buffer 48 by the internal clock, that is, the timing signal generated in the reception timing generation circuit 59.

To be more specific, the CPU 10a on the transmission side periodically issues a skip order set (hereinafter referred to as "SKPOS") of a fixed length. Subsequently, the CPU 10 on the reception side performs clock synchronization adjustment by observing the clock timing and deleting the SKPOS received from the elastic buffer 48.

The 19B/20B decoder 49 reads the parallel data stored in the elastic buffer 48. Subsequently, by performing opposite processing to that of the 19B/20B encoder 42, the 19B/20B decoder 49 decodes the original data from the read data and outputs the decoded data to the descrambler 50.

Figure 15:
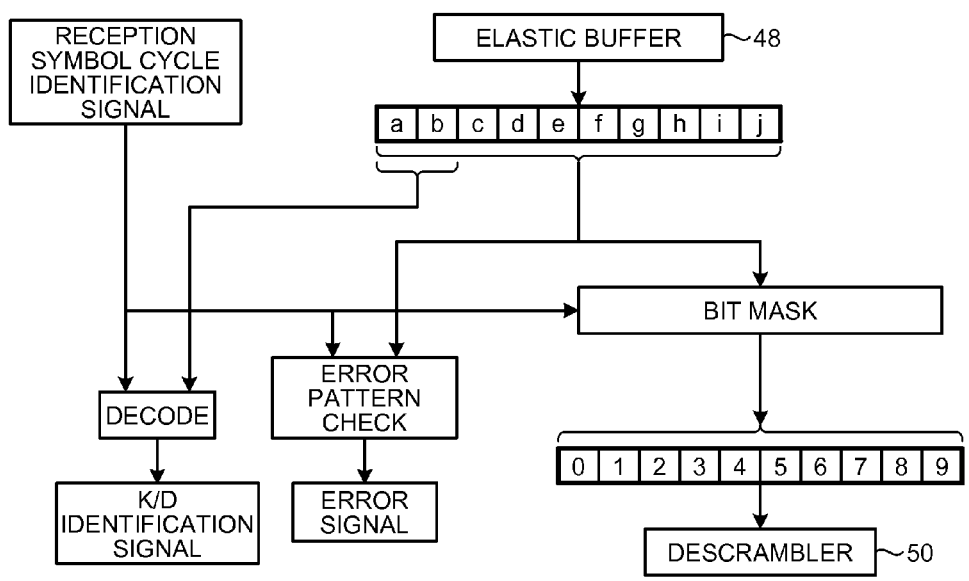
FIG. 15 is a diagram for explaining a specific example of a 19B/20B decoder according to the first embodiment.

Here, FIG. 15 is a diagram for explaining a specific example of the 19B/20B decoder according to the first embodiment. As illustrated in FIG. 15, the 19B/20B decoder 49 receives a reception symbol cycle identification signal from the reception timing generation circuit 59. Here, the reception symbol cycle identification signal is a similar signal to the transmission symbol identification signal and indicates whether 10-bit data read by the 19B/20B decoder 49 from the elastic buffer 48 is a first symbol or the 10-bit data is a second symbol.

For example, the reception timing generation circuit 59 outputs "0" or "1" as a transmission symbol cycle identification signal, while switching them in a predetermined period with respect to the end of a training sequence as a starting point. Here, the transmission symbol cycle identification signal "1" indicates that the received data is the second symbol, and the transmission symbol cycle identification signal "0" indicates that the received data is the first symbol.

As a specific example, in a case where data transmitted for the first time after the end of the training sequence is the second symbol, the reception timing generation circuit 59 outputs "1" as a transmission symbol cycle identification signal. Also, in a case where data transmitted for the first time after the end of the training sequence is the first symbol, the reception timing generation circuit 59 outputs "0" as a transmission symbol cycle identification signal.

For example, in a case where the CPU 10a alternately transmits the first symbol and the second symbol via lane #0 after the end of the training sequence, the reception timing generation circuit 59 alternately inputs the reception symbol cycle identification signals "0" and "1" in the 19B/20B decoder 49. Also, similar to the transmission timing generation circuit 57, the reception timing generation circuit 59 outputs signals indicating symbols transmitted via lanes #0 to #7, to the reception circuits 46 to 46b.

For example, in symbol time at which lanes #0 to #3 receive a first symbol and lanes #4 to #7 receive a second symbol, the reception timing generation circuit 59 outputs the following reception symbol cycle identification signals. That is, the reception timing generation circuit 59 outputs a reception symbol cycle identification signal "0" to the reception units of lanes #0 to #3 and outputs a reception symbol cycle identification signal "1" to the reception units of lanes #4 to #7.

The 19B/20B decoder 49 decides whether the reception symbol cycle identification signal is "1" or the signal is "0," and, in a case where the reception symbol cycle identification signal is "1," performs the following processing. That is, without applying a bit mask to 10-bit data "a" to "j" received from the elastic buffer 48, the 19B/20B decoder 49 outputs the data as is as 10-bit data to the descrambler 50.

Meanwhile, in a case where the reception symbol cycle identification signal value is "0," by decoding bits "a" and "b" among bits "a" to "j" of the read data, the 19B/20B decoder 49 decides whether the data is a D character or the data is a K character. To be more specific, in a case where bits "a" and "b" are "01" or "10," the 19B/20B decoder 49 decides that the read data is a D character. Subsequently, using a bit mask, the 19B/20B decoder 49 outputs bits "b" to "j" as is as bits 1 to 9 and outputs the value of bit 1 as 0 to the descrambler 50.

Also, in a case where bits "a" and "b" are "00" or "11," the 19B/20B decoder 49 decides that the read data is a K character. Subsequently, the 19B/20B decoder 49 outputs "1" as a K/D identification signal to the order set detection unit 55 and outputs bits "a" to "j" as is as a K character to the descrambler 50. Also, in a case where the read data is a K character, the 19B/20B decoder 49 checks an error pattern from bits "a" to "j," and, in a case where bits "a" to "j" are an invalid code, outputs "1" as an error signal to the order set detection unit 55.

Here, FIG. 16 is a diagram for explaining an operation of the 19B/20B decoder according to the first embodiment. FIG. 16 illustrates what kind of data the 19B/20B decoder 49 outputs according to the reception symbol cycle identification signal and the values of read bits "a" and "b." For example, in a case where the reception symbol cycle identification signal is "1," the 19B/20B decoder 49 outputs bits "a" to "j" as output data 0 to 9.

Also, in a case where the reception symbol cycle identification signal is "0" and bits "a" and "b" are "01" or "10," the 19B/20B decoder 49 decides that bits "c" to "j" are a D character. Therefore, the 19B/20B decoder 49 outputs data in which the head data 0 is "0" and bits "b" to "j" as data 1 to 9.

Also, in a case where the reception symbol cycle identification signal is "0" and bits "a" and "b" are "00" or "11," the 19B/20B decoder 49 decides that bits "c" to "j" are a K character. Therefore, in a case where bits "a" to "j" are not an invalid code, the 19B/20B decoder 49 outputs a K/D identification signal "1" and error signal "0." Also, the 19B/20B decoder 49 outputs bits "a" to "j," that is, outputs a K character as output data 0 to 9. Meanwhile, in a case where bits "a" to "j" are an invalid code, the 19B/20B decoder 49 outputs a K/D identification signal "0" and error signal "1."

Returning to FIG. 6, when receiving data from the 19B/20B decoder 49, the descrambler 50 converts the pseudo-randomized data into the original data by performing opposite processing to that of the scrambler 40. Subsequently, the descrambler 50 outputs the converted original data to the byte unstriping circuit 51. Also, the scrambler 40 and the descrambler 50 can naturally use a technique disclosed as a system of PCIe.

The byte unstriping circuit 51 performs opposite processing to that of the byte striping circuit 38, according to an unstriping timing signal from the unstriping timing generation circuit 60. That is, the byte unstriping circuit 51 rearranges the data received in the lane #0 reception unit 46 to the lane #7 reception unit 46b. Subsequently, the byte unstriping circuit 51 outputs the rearranged data to the data link layer function unit 34.

For example, the byte unstriping circuit 51 performs opposite processing to the sort performed by the byte striping circuit 38 as illustrated in FIG. 12 and FIG. 13. That is, in the even-number cycle, the byte unstriping circuit 51 acquires data nine bits at a time from lanes #0 to #3 and subsequently acquires data ten bits at a time from lanes #4 to #7 to form data. Also, in the odd-number cycle, the byte unstriping circuit 51 acquires data nine bits at a time from lanes #7 to #4 and subsequently acquires data ten bits at a time from lanes #3 to #0 to form data.

Next, functions to generate a K character will be explained. The LTSSM 52 denotes a state machine to perform initialization or link formation control on lanes #0 to #7. For example, according to an instruction from the data link layer function unit 34, the LTSSM 52 transits to a state for waiting for a link initialization instruction or a state for link initialization, retraining execution or power-saving mode.

Subsequently, the LTSSM 52 outputs an instruction based on the transit state to the striping timing generation circuit 58 and the order set generation unit 54. Also, the LTSSM 52 outputs an instruction based on the transit state to the transmission timing generation circuit 57, the order set decision unit 56, the reception timing generation circuit 59 and the unstriping timing generation circuit 60.

Figure 17:
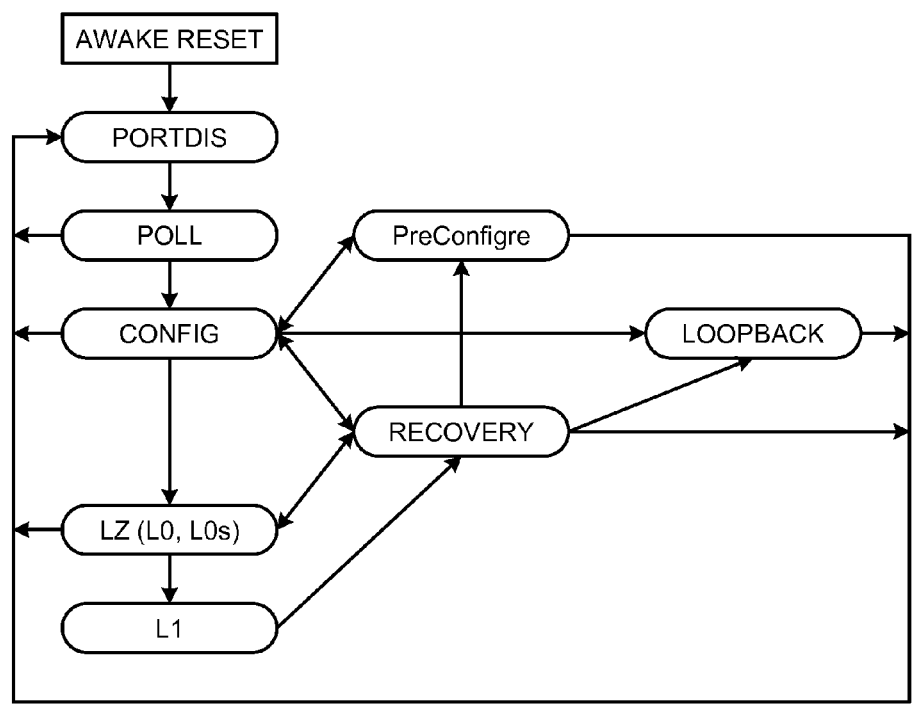
FIG. 17 is a diagram for explaining a condition transition of an LTSSM according to the first embodiment.

FIG. 17 is a diagram for explaining a condition transition of the LTSSM according to the first embodiment. The LTSSM 52 transits to a PORTDIS state after reset cancellation, and subsequently transits to each state illustrated in FIG. 17 according to the instruction from the data link layer function unit 34.

Here, each state condition illustrated in FIG. 17 will be explained using FIG. 18. FIG. 18 is a diagram for explaining each condition of the LTSSM. The PORTDIS state denotes a state for waiting for a link initialization instruction, and the LTSSM 52 transits to the PORTDIS state immediately after power activation or at the time a reset signal is cancelled. Also, at the time of the PORTDIS state, the LTSSM 52 transits to the POLL state according to an instruction from the outside of the physical layer function unit 35.

The POLL state denotes a state to transmit/receive a training order set (TS OS) to/from a connection destination port and check whether communication is possible. Also, at the time of the POLL state, in a case where communication with the connection destination port is possible, the LTSSM 52 transits to the CONFIG state.

The CONFIG state denotes a state to transmit/receive a TS OS to/from the connection destination port at the time of link initialization or retraining execution, and performs a link formation. Subsequently, at the time of the CONFIG state, in a case where the link formation is finished, the LTSSM 52 transits to the LZ (L0, L0s) state.

The L0 state denotes a state in which it is possible to transmit or receive a packet of a data link layer of a higher layer, and represents a normal operation condition in which data received from the data link layer is output to a differential transmission path or data received form the differential transmission path is output to the data link layer. Here, L0s denotes a power-saving state.

Also, the RECOVERY state denotes a state to perform retraining. Also, the L1 state denotes a state of a low power-saving condition, and the LTSSM 52 transits to the L0 state by performing retraining. Also, the LOOPBACK state denotes a state to test a loop back. Also, the PreConfigre state denotes a state where retraining is performed again when a multi-bit link error occurs during retraining.

Returning to FIG. 6, the DV/RV control unit 53 denotes a control circuit to control operations of the drivers 44 to 44b and the receivers 45 to 45b in lanes #0 to #7 according to the state indicated by the LTSSM 52.

The order set generation unit 54 generates an order set transmitted to the facing CPU 10a. To be more specific, the order set generation unit 54 generates an order set according to an instruction from the LTSSM 52 and outputs the generated order set to the selector 41. Also, the order set generation unit 54 outputs a skip order set (SKPOS) to the selector 41 at predetermined time intervals, apart from the instruction from the LTSSM 52.

Figure 19:
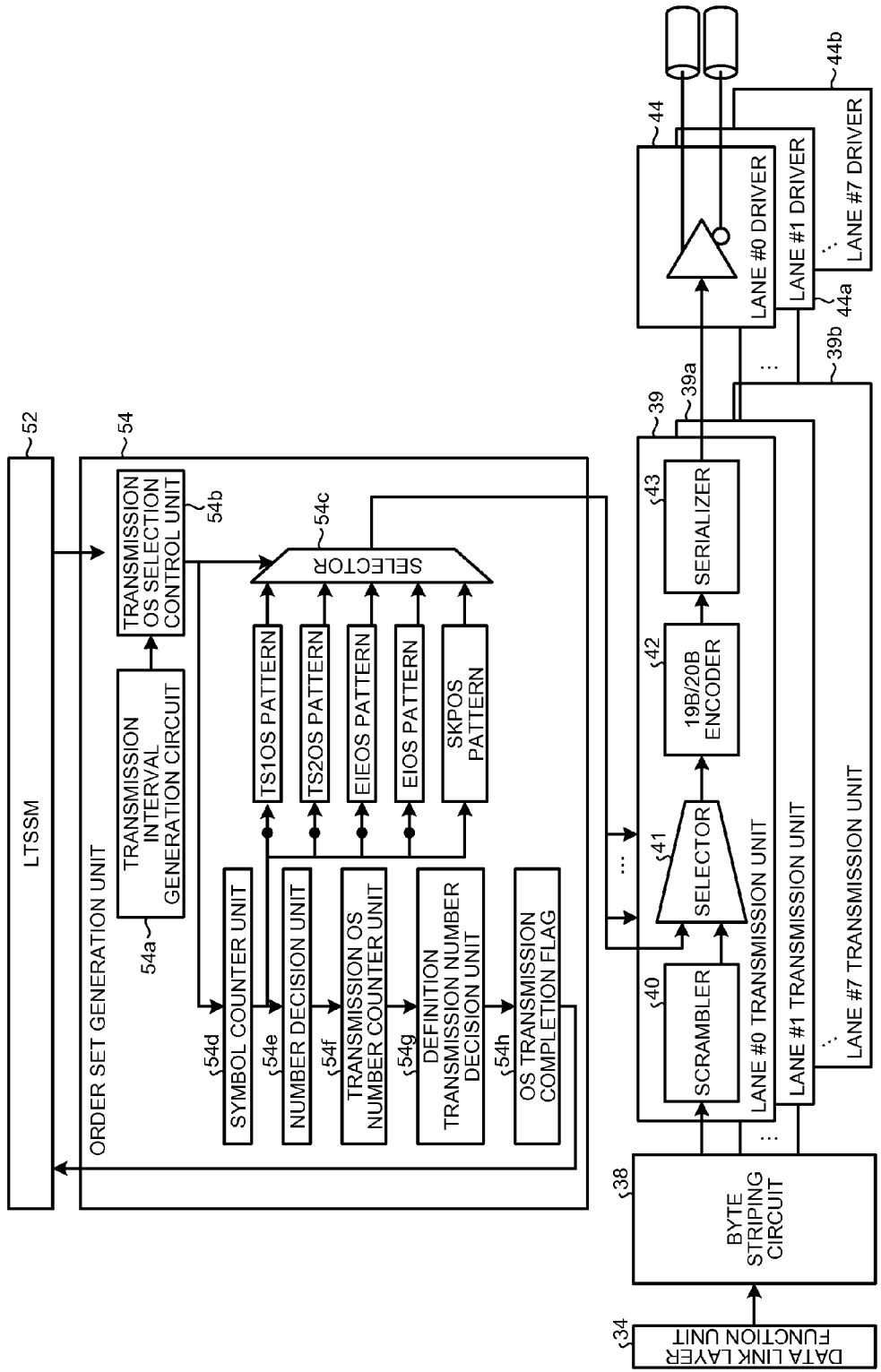
FIG. 19 is a diagram for explaining a functional configuration of an order set generation unit according to the first embodiment.

In the following, a functional configuration of the order set generation unit 54 will be explained using the drawings. FIG. 19 is a diagram for explaining a functional configuration of the order set generation unit according to the first embodiment. For example, in the example illustrated in FIG. 19, the order set generation unit 54 includes a transmission interval generation circuit 54a, a transmission OS (Ordered Set) selection control unit 54b, a selector 54c and a symbol counter unit 54d. Also, the order set generation unit 54 includes a number decision unit 54e, a transmission OS number counter unit 54f, a definition transmission number decision unit 54g and an OS transmission completion flag 54h.

Also, the order set generation unit 54 stores patterns "TS1OS," "TS2OS," "EIEOS," "EIOS" and "SKPOS" of order sets. The transmission interval generation circuit 54a instructs OS transmission to the transmission OS selection control unit 54b at predetermined time intervals. Also, in a case where OS transmission is instructed from the LTSSM 52, the transmission OS selection control unit 54b controls the selector 54c and outputs the OS instructed to be transmitted.

The symbol counter unit 54d counts the number of symbols transmitted for each OS. Also, in a case where the number of symbols of each OS counted by the symbol counter unit 54d reaches a predetermined value, the number decision unit 54e decides that an output of one set of OS is completed, and the transmission OS number counter unit 54f increments the count value by one for each OS. That is, the transmission OS number counter unit 54f counts the number of sets transmitted for each OS.

Here, in the case of performing link initialization, multiple OS sets are transmitted. Therefore, in a case where the number of OS sets transmitted reaches a prescribed number, by setting the OS transmission completion flag 54h, the definition transmission number decision unit 54g reports to the LTSSM 52 that OS transmission is completed.

Also, the order set generation unit 54 transmits the order set output by the selector 54c together with an order set valid signal, to the transmission units 39 to 39b of all lanes #0 to #7. Here, in the case of receiving the order set valid signal, the transmission unit 39 of lane #0 selects the order set received from the order set generation unit 54 in the selector 41 and inputs the order set in the 19B/20B encoder 42. Also, similar to the transmission unit 39, the transmission units 39a to 39b of other lanes #1 to #7 input an order set in the 19B/20B encoder 42.

Returning to FIG. 6, the order set detection unit 55 detects the order set received in the reception unit 46 of lane #0. Also, the order set decision unit 56 decides whether the reception units 46 to 46b of lanes #0 to #7 receive an order set.

In the following, functional configurations of the order set detection unit 55 and the order set decision unit 56 will be explained using FIG. 20. FIG. 20 is a diagram for explaining a functional configuration of the order set detection unit according to the first embodiment. In the example illustrated in FIG. 20, the order set detection unit 55 includes an expectation value calculation unit 55a, a correspondence check unit 55b, a symbol counter 56c, an OS length decision unit 56d and a reception OS number counter unit 56e. Also, the order set detection unit 55 includes a definition reception number decision unit 56f, an OS reception completion flag 55g and an SKPOS detection circuit 55h. Also, the order set decision unit 56 includes an AND mask 56a and an OR mask 56b.

For example, the order set detection unit 55 receives a K character from the 19B/20B decoder 49. Also, for each state of the LTSSM 52, the expectation value calculation unit 55a receives an instruction of an order set expected to be received, that is, an expectation value of an order set expected to be received, from the LTSSM 52. Subsequently, the correspondence check unit 55b checks whether the expectation value received in the expectation value calculation unit 55a corresponds to the received order set. In a case where the expectation value corresponds to the order set, the correspondence check unit 55b increments the value of the symbol counter 56c.

Also, the OS length decision unit 55d decides whether the value of the symbol counter 55c reaches a predetermined value, and, in a case where it reaches the predetermined value, the OS length decision unit 55d decides that one set of OS is received, and increments the reception OS number counter 55e. Also, in a case where the value of the reception OS number counter 55e reaches a predetermined value, the definition reception number decision unit 55f decides that a predetermined number of order sets is received, and, by setting the OS reception completion flag 55g, reports to the order set decision unit 56 that the order sets are received.

Also, using the AND mask 56a, the order set decision unit 56 calculates a logical sum of OS reception completion flags from the reception units 46 to 46b of lanes #0 to #7. In a case where OS reception completion flags of all reception units 46 to 46b are valid, the order set decision unit 56 reports to the LTSSM 52 that reception of an order set is completed.

Meanwhile, an SKPOS is periodically transmitted from the transmission side. Therefore, in the case of detecting reception of an SKPOS from the decision results in the correspondence check unit 55b and the OS length decision unit 55d, the SKPOS detection circuit 55h transmits an SKPOS detection signal to the order set decision unit 56. Subsequently, the order set decision unit 56 performs majority decision using the OR mask 56b.

To be more specific, according to a reception symbol cycle identification signal, the order set decision unit 56 decides a lane to receive a K character, that is, a lane to receive a first symbol among lanes #0 to #7, and decides from a majority of the decided lanes whether an SKPOS detection signal is received. Subsequently, in the case of receiving an SKPOS detection signal from the majority of the decided lanes, the order set decision unit 56 reports SKPOS detection to the LTSSM 52.

Here, FIG. 21 is a diagram for explaining a sequence of data output by a transmission unit according to the first embodiment. For example, in a case where link initialization is instructed from the outside of the physical layer function unit 35, the condition of the LTSSM 52 transits and the training sequence starts. In the training sequence, as illustrated in (G) in FIG. 21, a symbol including a control bit, that is, a first symbol is output in all lanes #0 to #7. At this time, the transmission units 39 to 39b each designate an order set for link initialization processing by an outputting K character.

Next, when the training sequence is finished, the LTSSM 52 transits to the L0 state. Therefore, as illustrated in (H) in FIG. 21, the transmission units 39 to 39b each start transferring data received from a data link layer. That is, the transmission units 39 to 39b each perform a normal operation. That is, at the time of the normal operation, the transmission units 39 to 39b each divide the data received from the data link layer by byte striping processing in lanes #0 to #7.

Subsequently, the transmission units 39 to 39b each perform 19B/20B conversion and perform serial transmission of converted data. Here, at the time of the normal operation, the transmission units 39 to 39b each switch and output a first symbol and a second symbol in a periodical manner, and at least one transmission unit transmits the first symbol. Also, as illustrated in FIG. 21, the transmission units 39 to 39b each are set such that, when the training sequence is finished, the symbol time to transmit the next symbol is the even-number cycle. After that, the transmission units 39 to 39b each switch between the even-number cycle and the odd-number cycle every one symbol to perform processing.

FIG. 22 is a diagram for explaining a skip order set according to the first embodiment. For example, as illustrated in (I) in FIG. 22, the transmission units 39 to 39a each periodically transmit K characters indicating a COM symbol and multiple SKP symbols, as an SKPOS.

Here, the timing illustrated in (J) in FIG. 22 is essentially the timing of the odd-number cycle, and therefore the reception units of lanes #4 to #7 report K character detection of an SKPOS to the order set decision unit 56. Therefore, the order set decision unit 56 decides whether a majority of lanes #4 to #7 receive K characters of a COM symbol, and, in a case where the majority of lanes #4 to #7 receive the K characters of the COM symbol, the order set decision unit 56 reports to the LTSSM 52 that an order set starts.

Here, the reception units 46 to 46b each are not in a normal operation state while transmission/reception of the SKPOS is performed, and data transmitted to the data link layer is invalid. Subsequently, when receiving a predetermined number of symbols of the SKPOS, the reception units 46 to 46b each change the condition to the normal operation state and start the symbol time from the even-number cycle as illustrated in (K) in FIG. 22.

Returning to FIG. 6, the transmission timing generation circuit 57 generates a transmission symbol cycle identification signal according to the outputs of the LTSSM 52 and the order set generation unit 54, and inputs it in the 19B/20B encoders of the transmission units 39 to 39b of lanes #0 to #7. Also, the striping timing generation circuit 58 generates a striping timing signal according to the outputs of the LTSSM 52 and the order set generation unit 54, and inputs the generated striping timing signal in the byte striping circuit 38.

Figure 23:
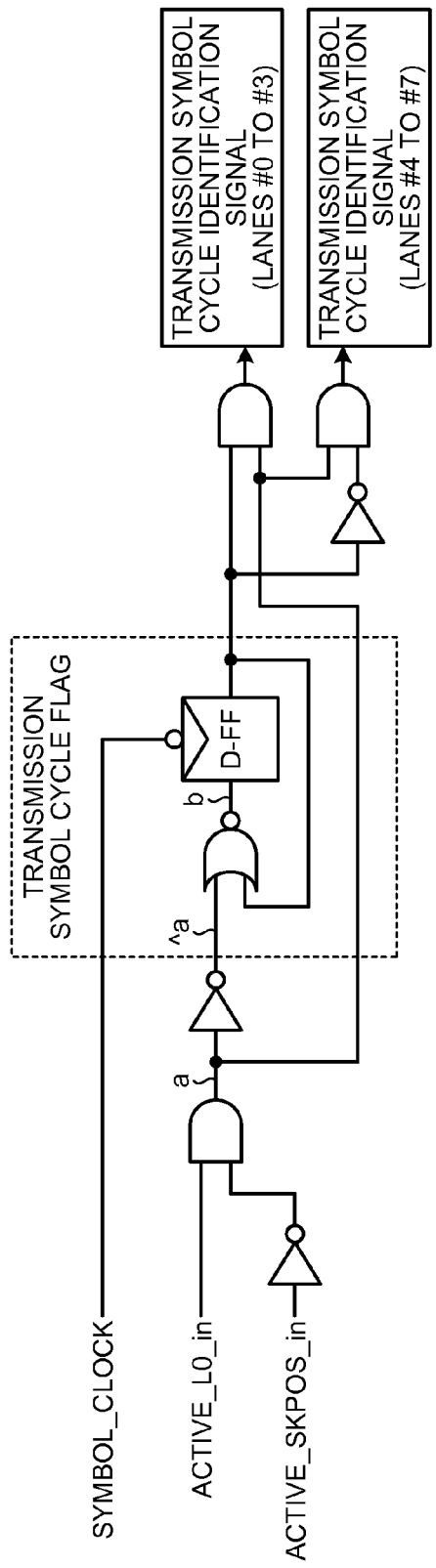
FIG. 23 is a diagram for explaining a transmission timing generation circuit according to the first embodiment.

Here, an example of the transmission timing generation circuit 57 and the striping timing generation circuit 58 will be explained using FIG. 23. FIG. 23 is a diagram for explaining the transmission timing generation circuit according to the first embodiment. Also, although FIG. 23 illustrates an operation principle of the transmission timing generation circuit 57, if the operation timing is logically the same, it can be realized by other logical circuit configurations. Also, although FIG. 23 illustrates an example of the transmission timing generation circuit 57, regarding the striping timing generation circuit 58, an input signal and an output signal are connected to different circuits, but it can be realized by the similar operation principle.

An input signal SMBOL_CLOCK illustrated in FIG. 23 is a reference clock of one symbol time and denotes a signal toggled every reception or transmission of a first symbol or second symbol. Also, ACTIVE_L0_in denotes a signal generated in the LTSSM 52 and indicates that the LTSSM 52 is in the L0 state condition. Also, ACTIVE_SKPOS_in denotes a signal generated in the order set generation unit 54 and indicates that an SKPOS is currently transmitted.

In the example illustrated in FIG. 23, the transmission timing generation circuit 57 outputs a transmission symbol cycle identification signal of value "0" or "1" to the transmission units of lanes #0 to #3 according to the values of SMBOL_CLOCK, ACTIVE_L0_in and ACTIVE_SKPOS_in. Also, the transmission timing generation circuit 57 outputs a transmission symbol cycle identification signal of a value opposite to that for the transmission units of lanes #0 to #3, to the transmission units of lanes #4 to #7.

For example, in the next symbol time after the training sequence is finished, the transmission timing generation circuit 57 outputs the transmission symbol cycle identification signal "1" to the transmission units of lanes #4 to #7 and subsequently outputs "0" and "1" in an alternate manner. Also, in the next symbol time after the training sequence is finished, the transmission timing generation circuit 57 outputs the transmission symbol cycle identification signal "0" to the transmission units of lanes #0 to #3 and subsequently outputs "1" and "0" in an alternate manner.

Figure 24:
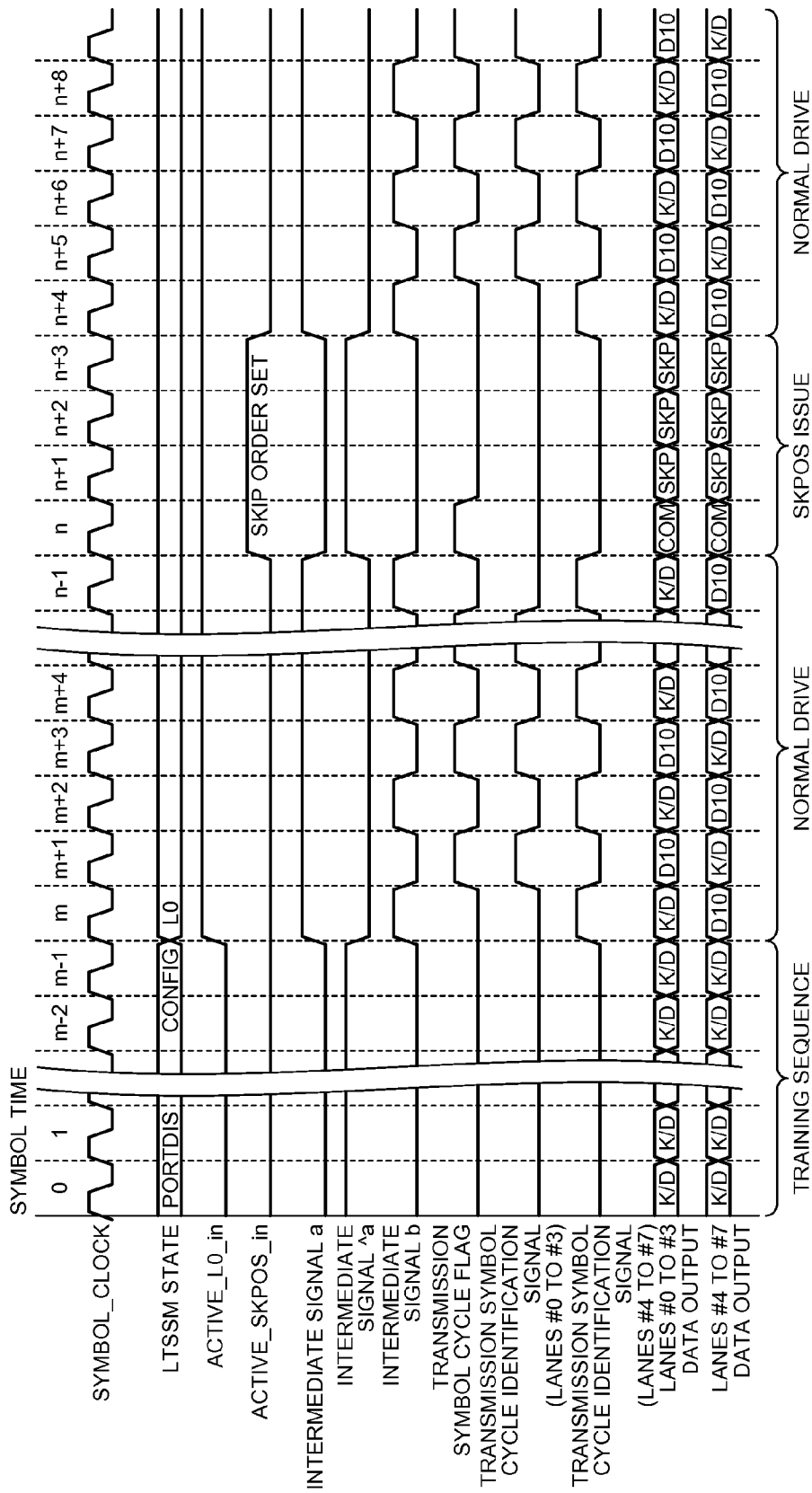
FIG. 24 is a timing chart for explaining an operation of a transmission timing generation circuit according to the first embodiment.

Here, an operation of the transmission timing generation circuit 57 illustrated in FIG. 23 will be explained using FIG. 24. FIG. 24 is a timing chart for explaining an operation of the transmission timing generation circuit according to the first embodiment. Also, FIG. 24 illustrates SYMBOL_CLOCK, a state of LTSSM, ACTIVE_L0_in and ACTIVE SKPOS_in.

Also, FIG. 24 illustrates an intermediate signal "a," intermediate signal "^ a," intermediate signal "b," transmission symbol cycle flag, transmission symbol cycle identification signals output to lanes #0 to #7, and data output to lanes #0 to #7. Also, among the signals illustrated in FIG. 24, the intermediate signal "a," the intermediate signal "^ a" and the intermediate signal "b" represent signals flown in "a," "^ a" and "b" in FIG. 23.

For example, in the example illustrated in FIG. 24, the state of the LTSSM 52 is "PORTDIS" when the symbol time is "0." Therefore, the transmission units 39 to 39b each start the training sequence. Here, in the training sequence, all the symbol cycle identification signals are "0," and one of a D character and a K character is selected and output to lanes #0 to #7.

Here, link initialization is finished in symbol time "m" and the condition of the LTSSM 52 transits from the CONFIG state to the L0 state. Therefore, the ACTIVE_L0_in signal transits to "1," the transmission symbol cycle flag starts to toggle and the transmission symbol cycle identification signals are output. That is, the transmission units 39 to 39b each are in a normal operation condition.

Here, in symbol time "n," a periodical SKPOS is transmitted. Here, the SKPOS is periodically output while the state of the LTSSM 52 is the L0 state. Therefore, the ACTIVE_L0_in signal and the ACTIVE_SKPOS_in signal have a value of "1" at the same time. This condition is an output condition of a skip adjustment order set and is therefore a different state from a normal operation.

Here, in the symbol time "n," since transmission of the SKPOS is instructed, all the transmission symbol cycle identification signals transit to "0," and "COM" which is the first K character of the SKPOS is output to lanes #0 to #7. After that, "SKP" characters corresponding to a predetermined number of cycles are output to lanes #0 to #7.

After that, when the "SKP" characters corresponding to the predetermined number of cycles are output, in symbol time "n+4," they transit to a normal operation condition, and, similar to the symbol time "m," the symbol time starts from the even-number cycle. Subsequently, as long as the transmission units 39 to 39b each are in the normal operation condition, they perform serial transmission of data while switching between the even-number cycle and the odd-number cycle.

Returning to FIG. 6, the reception timing generation circuit 59 generates a reception symbol cycle identification signal indicating the timing the reception units 46 to 46b of lanes #0 to #7 each receive data, according to the outputs from the order set decision unit 56 and the LTSSM 52. Also, the unstriping timing generation circuit 60 generates an unstriping timing signal according to the outputs from the order set decision unit 56 and the LTSSM 52.

Figure 25:
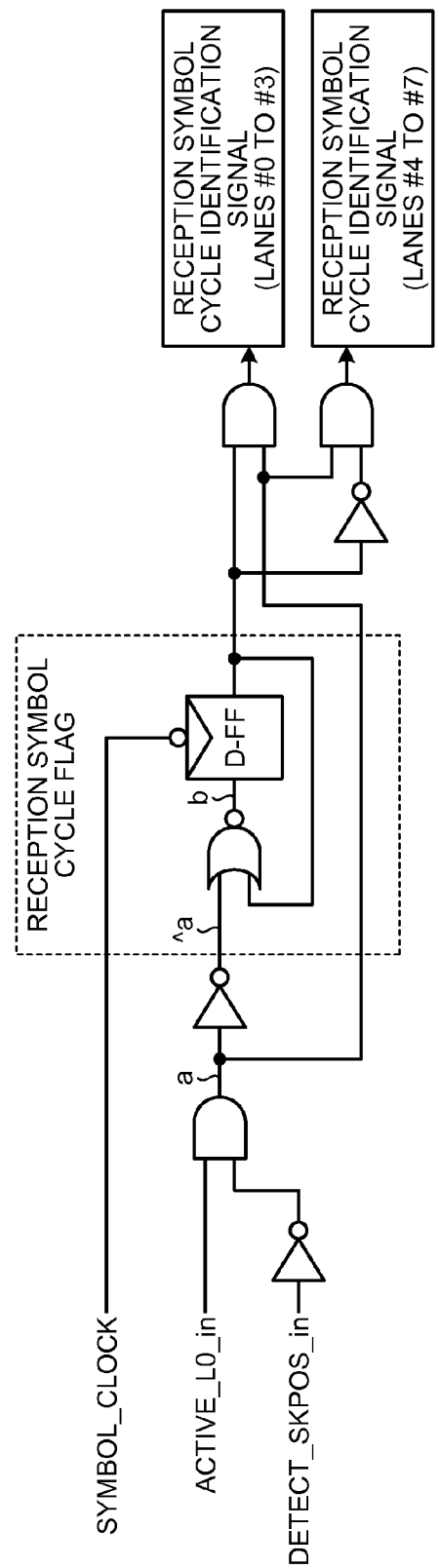
FIG. 25 is a diagram for explaining a reception timing generation circuit according to the first embodiment.

Here, an example of the reception timing generation circuit 59 and the unstriping timing generation circuit 60 will be explained using FIG. 25. FIG. 25 is a diagram for explaining the reception timing generation circuit according to the first embodiment. Also, although FIG. 25 illustrates an operation principle of the reception timing generation circuit 59, if the operation timing is logically the same, it can be realized by other logical circuit configurations.

Also, although FIG. 25 illustrates an example of the reception timing generation circuit 59, regarding the unstriping timing generation circuit 60, an input signal and an output signal are connected to different circuits, but it can be realized by the similar operation principle.

Also, as illustrated in FIG. 25, the reception timing generation circuit 59 has the similar circuit configuration to that of the transmission timing generation circuit 57. That is, the reception timing generation circuit 59 has the similar functions to those of the transmission timing generation circuit 57, except for receiving DETECT_SKPOS_in instead of ACTIVE_SKPOS_in. That is, in the next symbol time after the training sequence is finished, the reception timing generation circuit 59 outputs the reception symbol cycle identification signal "1" to the transmission units of lanes #4 to #7 and subsequently outputs "0" and "1" in an alternate manner. Also, in the next symbol time after the training sequence is finished, the reception timing generation circuit 59 outputs the reception symbol cycle identification signal "0" to the transmission units of lanes #0 to #3 and subsequently outputs "1" and "0" in an alternate manner.

Here, DETECT_SKPOS_in denotes a signal output by the order set decision unit 56 when an SKPOS is detected. Also, similarly, the unstriping timing generation circuit 60 has the similar circuit configuration to that of the striping timing generation circuit 58 and has the similar functions.

FIG. 26 is a timing chart for explaining an operation of the reception timing generation circuit according to the first embodiment. Also, FIG. 26 illustrates a reception symbol cycle flag and reception symbol cycle identification signals instead of the transmission symbol cycle flag and the transmission cycle identification signals illustrated in FIG. 24.

For example, in the example illustrated in FIG. 26, the state of the LTSSM 52 is "PORTDIS" in symbol time "0." Subsequently, all the reception symbol cycle identification signals are "0" and therefore the reception units 46 to 46b each receive one of a D character and a K character.

Here, link initialization is finished in symbol time "m" and the condition of the LTSSM 52 transits from the CONFIG state to the L0 state. Therefore, the ACTIVE_L0_in signal transits to "1," the reception symbol cycle flag starts to toggle and the reception symbol cycle identification signals are output. That is, the reception units 46 to 46b each are in a normal operation condition and output data received from lanes #0 to #7, to the data link layer.

Here, since the cycle time is the even-number cycle in the symbol time "m," the reception units of lanes #0 to #3 receive a 9-bit D character or K character and the reception units of lanes #4 to #7 receive a 10-bit D character. Subsequently, since the reception symbol flag is reversed and becomes the odd-number cycle in symbol time "m+1," the reception units of lanes #0 to #3 receive a 10-bit D character and the reception units of lanes #4 to #7 receive a 9-bit D character or K character.

Here, in the symbol time "n," the reception units 46 to 46b of lanes #0 to #7 receive a "COM" symbol which is the head character of an SKPOS. Therefore, the ACTIVE_L0_in signal and the DETECT_SKPOS_in signal have a value of "1" at the same time.

Here, in the symbol time "n," the order set detection unit 55 does not recognize reception of the SKPOS and, when receiving a "SKP" symbol subsequent to "COM" in the symbol time "n+1," detects the reception of SKPO. Therefore, in the symbol time "n," it is the odd-number cycle in the symbol time "n," and therefore the order set decision unit 56 decides a COM character by majority decision with signals from the reception units of lanes #4 to #7.

After that, when "SKP" characters corresponding to a predetermined number of cycles are output, they transit to a normal operation condition in symbol time "n+4," and, similar to the symbol time "m," the symbol time starts from the even-number cycle. Subsequently, as long as the reception units 46 to 46b each are in the normal operation condition, they receive data while switching between the even-number cycle and the odd-number cycle, and output the data to a data link apparatus.

For example, the serial interface ports 30 to 32, the transaction layer function unit 33, the data link layer function unit 34, the physical layer function unit 35, the physical layer logical sub-block 36 and the physical layer electric sub-block 37 are electronic circuits. Also, the byte striping circuit 38, the transmission units 39 to 39b, the scrambler 40, the selector 41, the 19B/20B encoder 42, the serializer 43 and the drivers 44 to 44b are electronic circuits.

Also, the receivers 45 to 45b, the reception units 46 to 46b, the symbol lock deserializer 47, the 19B/20B decoder 49, the descrambler 50 and the byte unstriping circuit 51 are electronic circuits. Also, the LTSSM 52, the DV/RV control unit 53, the order set generation unit 54, the order set detection unit 55, the order set decision unit 56, the transmission timing generation circuit 57 and the striping timing generation circuit 58 are electronic circuits.

Also, the reception timing generation circuit 59 and the unstriping timing generation circuit 60 are electronic circuits. Here, as an example of the electronic circuits, an integrated circuit such as an ASIC (Application Specific Integrated Circuit) and FPGA (Field Programmable Gate Array), or a CPU (Central Processing Unit) or MPU (Micro Processing Unit) is applied. Also, the elastic buffer 48 is a semiconductor memory chip such as RAM (Random Access Memory).

Effect of First Embodiment

As described above, the CPU 10 includes the plurality of lanes #0 to #7 to transmit data one bit at a time. Also, the CPU 10 includes the plurality of transmission units 39 to 39b that generate a first symbol, which is a 9-bit D character or a K character with a 1-bit control bit, or a second symbol which is a 10-bit D character.

Here, the transmission units 39 to 39b each switch and generate the first symbol and the second symbol in a predetermined period, and at least one transmission unit generates the first symbol in each symbol time. The CPU 10 transmits the first symbols and the second symbols generated by the transmission units 39 to 39b, to the CPU 10a via respective lanes #0 to #7.

Therefore, the CPU 10 can improve the efficiency of serial transmission. For example, in each symbol time, the CPU 10 can transmit four 9-bit D characters and four 10-bit D characters, that is, a 76-bit D character in total. Therefore, in each symbol, the CPU 10 transmits 80-bit data including control bits, which results in that a band is consumed only by 5%.

Also, the CPU 10 transmits a first symbol including a control bit to lanes #0 to #7 in a predetermined period. Therefore, the CPU 10 continues to transmit data including at least one bit transition per 20 bits, to lanes #0 to #7. Also, the CPU 10 transmits at least one first symbol that can include a K character in each symbol time.

Therefore, the CPU 10 can improve the efficiency of serial transmission without impairing a function of adequately performing serial transmission in lanes #0 to #7. That is, by storing a K character in a first symbol, the CPU 10 can fulfill a serial transmission function to perform a link initialization operation or clock jitter adjustment on the transmission/reception side. Therefore, the CPU 10 can improve the efficiency of serial transmission without impairing a function of performing serial transmission. Also, the CPU 10 outputs a first symbol including a control bit to lanes #0 to #7 in a predetermined period, which can facilitate clock regeneration in the facing apparatus.

Also, the CPU 10 causes one of transmission units that transmit a second symbol, to generate a second symbol storing CRC, which is used to detect a 10-bit error, from data transmitted in the identical symbol time and transmit the second symbol to the CPU 10a in the same symbol time as other data. Therefore, the CPU 10 can ensure detection of a burst error caused in any one lane. In the following, the point will be explained using FIG. 27 and FIG. 28, where the CPU 10 ensures detection of a burst error in one lane.

FIG. 27 is a diagram for explaining a burst error in lane #2. For example, as illustrated in the hatching in FIG. 27, it is assumed that an error occurs in all bits transmitted via lane #2. As a result, the CPU 10a performs byte unstriping on the data illustrated in FIG. 27 and forms data so as to output data illustrated in FIG. 28 to a data link layer.

FIG. 28 is a diagram for explaining data received at the time a burst error occurs. For example, FIG. 28 illustrates the data illustrated by the hatching in FIG. 27, that is, error data by the hatching. As illustrated in FIG. 28, the CPU 10a receives a packet including an error bit in a range of ten consecutive bits in data received for each symbol time. Therefore, the CPU 10a can detect an error using 10-bit CRC received every identical symbol time.

That is, the CPU 10 generates CRC that can detect an error of the same length as symbols transmitted via lanes #1 to #7, and, in the case of transmitting the generated CRC in the same symbol time as other symbols, it is possible to necessarily detect a burst error in any one lane. Therefore, even in a case where a burst error occurs unlimitedly in any one lane, the CPU 10 can necessarily detect an error in the facing apparatus.

Also, there is a well-known technique to improve signal quality using a DFE (Decision Feed Back Equalizer) on the signal reception side in serial transmission. However, since the DFE technique operates under the principle of determining a current threshold based on a past signal logic in a receiver, in a case where an error occurs once, there is a tendency that the error continues over a long period. As a result, there is a high possibility that a burst error occurs in the receiver to which the DFE technique is applied.

However, even in a case where a burst error unlimitedly occurs in any one lane, the CPU 10 can detect an error. Therefore, even when the DFE technique is applied to the facing apparatus, the CPU 10 can ensure error detection in the facing apparatus.

Also, in the case of transmitting a first symbol including a D character, the transmission units 39 to 39b each generate a first symbol acquired by attaching a control bit of a reversal value of the head bit value of the D character to the D character. Therefore, at least one bit transition is included in the first symbol including a D character, and, as a result, the CPU 10 can facilitate clock regeneration in the facing apparatus.

Also, in the case of transmitting a K character, the transmission units 39 to 39b each generates a first symbol with a control bit of the same value as that of the head bit of the K character. Therefore, the CPU 10 can facilitate K character identification in the facing apparatus. Also, in a case where at least one bit transition is included in a K character set in advance, the CPU 10 can further facilitate clock regeneration in the facing apparatus.

Also, the transmission units 39 to 39b are divided into two groups and each group switches and generates a first symbol and a second symbol. Therefore, the CPU 10 can facilitate clock regeneration in the facing apparatus. Also, the CPU 10 causes any of transmission units that generate a second symbol, to output CRC to detect an error from a first symbol or second symbol, as a second symbol, and therefore it is possible to ensure burst error detection in any one lane.

[b] Second Embodiment

Although the first embodiment has been described above, the present invention can be implemented in various different forms from the above example. Here, other examples included in the present invention will be explained below as a second embodiment.

(1) Regarding the Number of Lanes

The above CPU 10 transmits data via eight lanes #0 to #7. However, the example is not limited to this and the CPU 10 can perform serial transmission of data via an arbitrary number of lanes as long as multiple lanes are given.

That is, the CPU 10 may adequately select the size of one first symbol or second symbol and the bit number of data sorted into each lane at the time of striping, according to the number of lanes. For example, in the case of transmitting data via sixteen lanes, the CPU 10 may sort 5-bit data into twelve lanes and 4-bit data into four lanes. Also, the CPU 10 may sort CRC, which can detect a 5-bit error, into any of lanes into which 5-bit data is sorted.

For example, the CPU 10 may have two lanes. In such a case, the CPU 10 includes the transmission units 39 and 30a that generates a first symbol attaching a 1-bit control bit to data of a predetermined data length or a second symbol, which is data longer than the predetermined data length by one bit, in transmission data in a predetermined order, and transmit symbols in respective transmission paths. Here, the CPU 10 shift the symbol times for the transmission units 39 and 39a transmit the first symbols, so as not to overlap the symbol times. As a result, the CPU 10 can improve the efficiency of serial transmission.

(2) Regarding Symbol Time

The CPU 10 transmits 76-bit data via eight lanes every one symbol time. However, the example is not limited to this. For example, by transmitting a second symbol from six lanes and a first symbol from two lanes every one symbol time, the CPU 10 may transmit 78-bit data.

FIG. 29 is a diagram for explaining variations of data outputs. In the example illustrated in FIG. 29, the CPU 10 divides lanes #0 to #7 into four groups, each of which is formed with two lanes, and each group outputs a first symbol alternately. To be more specific, the CPU 10 does not count the symbol time in the even-number cycle and the odd-number cycle, but counts it in four cycles of an A cycle, B cycle, C cycle and D cycle.

Subsequently, the CPU 10 outputs first symbols from the first group in the A cycle, the second group in the B cycle, the third group in the C cycle and the fourth group in the D cycle. Therefore, in lanes #0 to #7, although the first symbol is transmitted every four cycles, there is no problem when the CPU 10a can perform clock regeneration by one bit transition in 40 bits.

FIG. 30 is a diagram for explaining an example of data output at the time of each cycle. Also, FIG. 30 illustrates an example of data transmitted to lanes #0 to #7 at the times of the A cycle to the D cycle. In each cycle, as illustrated in FIG. 30, the CPU 10 performs striping of data in lanes #0 to #7 and transmits a first symbol attaching a 1-bit control bit to a 9-bit D character and a second symbol corresponding to a 10-bit D character. Therefore, the CPU 10 can facilitate clock regeneration in the facing apparatus and perform serial transmission with reducing a transmission path band.

(3) Regarding CRC

The above CPU 10 transmits first symbols and second symbols via the plurality of lanes #0 to #7 in one symbol time which storing CRC to detect an error of the same length as other symbols in one of the second symbols. However, the example is not limited to this. For example, the CPU 10 may transmit a redundant bit by other algorithms, instead of CRC. That is, the CPU 10 may store an arbitrary redundant bit that can detect an error of the same length as other symbols in one of the second symbols and transmit it in the same symbol time as other symbols of error detection targets.

It is possible to improve the efficiency of serial transmission.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data transmission apparatus comprising:
   a plurality of transmission paths that each transmit data one bit at a time;
   a plurality of transmission data generation units that each generate a first symbol by attaching one control bit to data of a predetermined bit length or to control data of the predetermined bit length, or a second symbol of a bit length longer than the predetermined bit length by one bit, wherein the data of the predetermined bit length is included in transmission target data, the control data is used for performing an adjustment for the transmission paths, and the second symbol is data included in the transmission target data; and
   a plurality of transmission units that each transmit in a period the first symbol or the second symbol generated by the respective transmission data generation units, to a facing apparatus via the respective transmission paths of the transmission data generation units, the transmission target data being transmitted in the period, wherein
   the plurality of transmission data generation units each switch between generating the first symbol and generating the second symbol for each of the period, and,
   in the period at least one transmission data generation unit generates the first symbol and at least another transmission data generation unit generates the second symbol.

2. The data transmission apparatus according to claim 1, wherein
   one of the plurality of transmission data generation units generates in the period a second symbol including redundant bits to detect an error from the first symbol and the second symbol generated by another transmission data generation unit, and
   the transmission unit units each transmit the generated first or second symbol to the facing apparatus in the period.

3. The data transmission apparatus according to claim 1, wherein
   the plurality of transmission data generation units are divided into a plurality of groups, and
   in the period one of the groups generates the first symbol and in a period subsequent to the period another group generates the first symbol.

4. The data transmission apparatus according to claim 1, wherein
in the period at least one transmission data generation unit generates the first symbol, at least another transmission data generation unit generates the second symbol, in a period subsequent to the period the at least one transmission data generation unit generates the second symbol, and the at least another transmission data generation unit generates the first symbol.

5. A data transmission apparatus comprising:
a plurality of transmission paths that each transmit data one bit at a time;
a plurality of transmission data generation units that each generate a first symbol by attaching a control bit to head of data of a predetermined bit length wherein the control bit having an inverted value of a head bit value of the data or to head of control data of the predetermined bit length wherein the control bit having a same value of a head bit value of the control data, or a second symbol of a bit length longer than the predetermined bit length by one bit, wherein the data of the predetermined bit length is included in transmission target data, the control data is used for performing an adjustment for the transmission paths, and the second symbol is data included in the transmission target data; and
a plurality of transmission units that each transmit in a period the first symbol or the second symbol generated by the respective transmission data generation units, to a facing apparatus via the respective transmission paths of the transmission data generation units, the transmission target data being transmitted in the period, wherein
the plurality of transmission data generation units each switch between generating the first symbol and generating the second symbol for each of the period, and,
in the period at least one transmission data generation unit generates the first symbol and at least another transmission data generation unit generates the second symbol.

6. A data transmission system comprising:
a transmission side apparatus;
a reception side apparatus; and
a plurality of transmission paths that each transmit data one bit at a time between the transmission side apparatus and the reception side apparatus, wherein the transmission side apparatus includes,
a plurality of transmission data generation units that each generate a first symbol by attaching one control bit to data of a predetermined bit length or to control data of the predetermined bit length, or a second symbol of a bit length longer than the predetermined bit length by one bit, wherein the data of the predetermined bit length is included in transmission target data, the control data is used for performing an adjustment for the transmission paths, and the second symbol is data included in the transmission target data, and
a plurality of transmission units that each transmit in a period the first symbol or the second symbol generated by the respective transmission data generation units, to the reception side apparatus via the respective transmission paths of the transmission data generation units, the transmission target data being transmitted in the period,
the reception side apparatus includes,
a plurality of reception units that each receive the first symbol or the second symbol via the respective transmission paths, and
a regeneration unit that regenerates a clock to receive the first symbol or the second symbol from an edge of a bit transition included in the first symbol received by the reception units; wherein
the plurality of transmission data generation units each switch between generating the first symbol and generating the second symbol for each of the period, and
in the period at least one transmission data generation unit generates the first symbol and at least another transmission data generation unit generates the second symbol.

7. A data transmission method performed by a data transmission apparatus, the data transmission method comprising:
transmitting, in a period, a first symbol including data of a predetermined bit length and one control bit wherein the data is included in transmission target data or including control data of the predetermined bit length used for performing an adjustment for transmission paths and one control bit via at least one of the transmission paths that each transmit data one bit at a time, and transmitting a second symbol including data of a bit length longer than the predetermined bit length by one bit wherein the data is included in the transmission target data that is transmitted in the period via at least another transmission path; and
switching between transmitting the first symbol and transmitting the second symbol per the period.

8. A data transmission apparatus comprising:
a first data generation unit that generates a first data obtained by attaching one control bit to data of a first data length included in transmission data, and generates a second data whose data length is longer by one bit than the first data length;
a first transmission unit that transmits the first data generated by the first data generation unit and the second data generated by the first data generation unit, in a predetermined order via a first transmission path;
a second data generation unit that generates the first data and the second data; and
a second transmission unit that transmits the first data generated by the second data generation unit and the second data generated by the second data generation unit via a second transmission path, wherein
a transmission period in which the first transmission unit transmits the first data and a transmission period in which the second transmission unit transmits the first data are shifted so as not to temporally overlap.

* * * * *